United States Patent
Hara et al.

(10) Patent No.: US 10,431,446 B2
(45) Date of Patent: Oct. 1, 2019

(54) WET PROCESSING APPARATUS

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Sommawan Khumpuang, Tsukuba (JP); Shinichi Ikeda, Tsukuba (JP); Akihiro Goto, Yaizu (JP); Hiroshi Amano, Yaizu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 82 days.

(21) Appl. No.: 15/037,886

(22) PCT Filed: Dec. 1, 2014

(86) PCT No.: PCT/JP2014/081774
§ 371 (c)(1),
(2) Date: May 19, 2016

(87) PCT Pub. No.: WO2015/083669
PCT Pub. Date: Jun. 11, 2015

(65) Prior Publication Data
US 2016/0293401 A1    Oct. 6, 2016

(30) Foreign Application Priority Data

Dec. 2, 2013    (JP) .................................. 2013-249358
Dec. 2, 2013    (JP) .................................. 2013-249362

(51) Int. Cl.
*H01L 21/02*    (2006.01)
*H01L 21/67*    (2006.01)
(Continued)

(52) U.S. Cl.
CPC .......... *H01L 21/02057* (2013.01); *B08B 3/08* (2013.01); *B08B 3/10* (2013.01);
(Continued)

(58) Field of Classification Search
None
See application file for complete search history.

(56) References Cited

U.S. PATENT DOCUMENTS

| | | | |
|---|---|---|---|
| 2002/0096196 A1 | 7/2002 | Toshima et al. | |
| 2005/0058775 A1* | 3/2005 | Oku | B05D 1/005 427/240 |
| 2008/0017613 A1* | 1/2008 | Nogami | H01L 21/67069 216/58 |

FOREIGN PATENT DOCUMENTS

| | | |
|---|---|---|
| JP | H09-213610 A | 8/1997 |
| JP | 2000-164555 A | 6/2000 |

(Continued)

OTHER PUBLICATIONS

English Translation JP 2002-343759, accessed on Oct. 2017.*
(Continued)

*Primary Examiner* — Eric W Golightly
*Assistant Examiner* — Arlyn I Rivera-Cordero
(74) *Attorney, Agent, or Firm* — Oliff PLC

(57) ABSTRACT

A wafer cleaner and a method therefor that efficiently cleans a wafer with a little amount of a cleaning liquid and efficiently performs a heating wet cleaning processing. The present invention includes a stage where a wafer is placed, a rotary driving unit that rotates the stage in a circumferential direction, a liquid discharge nozzle disposed facing the wafer placed on the stage and supplies a cleaning liquid on the wafer placed on the stage, and a control unit that causes the liquid discharge nozzle to supply a space between the wafer placed on the stage and the liquid discharge nozzle with a predetermined amount of the cleaning liquid to fill the (Continued)

space. The present invention also includes a lamp disposed on a position facing the wafer placed on the stage to heat at least an interface portion of the wafer and a cleaning liquid.

13 Claims, 11 Drawing Sheets

(51) Int. Cl.
H01L 21/687 (2006.01)
B08B 3/08 (2006.01)
B08B 3/10 (2006.01)
B08B 3/12 (2006.01)

(52) U.S. Cl.
CPC ............ *B08B 3/12* (2013.01); *H01L 21/6708* (2013.01); *H01L 21/67051* (2013.01); *H01L 21/67115* (2013.01); *H01L 21/68764* (2013.01); *H01L 21/02052* (2013.01)

(56) References Cited

FOREIGN PATENT DOCUMENTS

| JP | 2002-343759 | * 11/2002 | ............... G02F 1/13 |
| JP | 2002-343759 A | 11/2002 | |
| JP | 2006-156945 A | 6/2006 | |
| JP | 2007-234812 A | 9/2007 | |
| JP | 2009-233493 A | 10/2009 | |
| JP | 2012-138510 A | 7/2012 | |
| JP | 2013-105974 A | 5/2013 | |
| WO | 2012/029775 A1 | 3/2012 | |
| WO | 2013/084574 A1 | 6/2013 | |

OTHER PUBLICATIONS

English Translation of JP 2009233493, accessed on Mar. 2018. (Year: 2009).*

Feb. 17, 2015 International Search Report issued in International Patent Application No. PCT/JP2014/081774.

Aug. 1, 2017 Office Action issued in Japanese Patent Application No. 2013-249358.

May 3, 2019 Office Action issued in Korean Patent Application No. 10-2019-7005361.

* cited by examiner

FIG. 6A
FIG. 6B
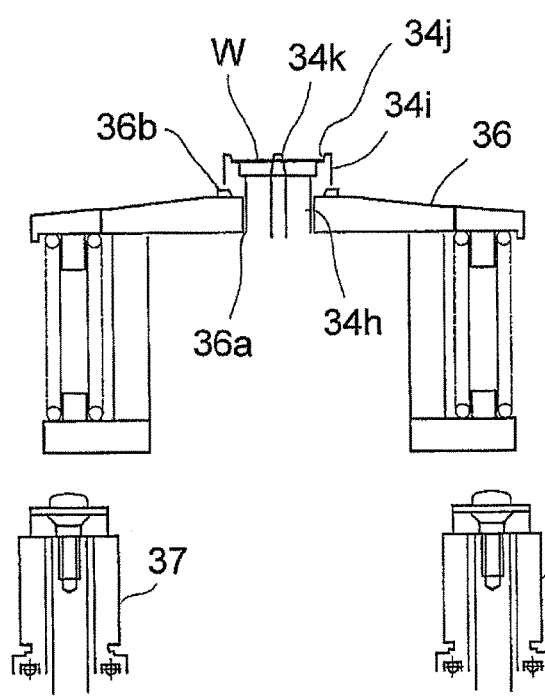
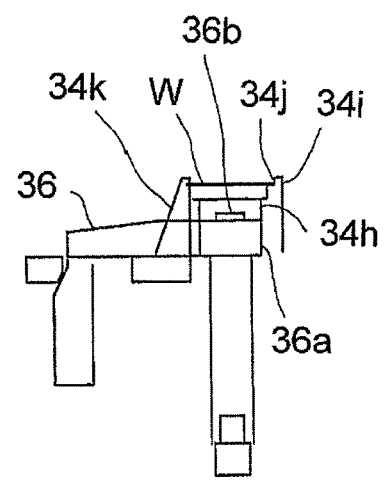

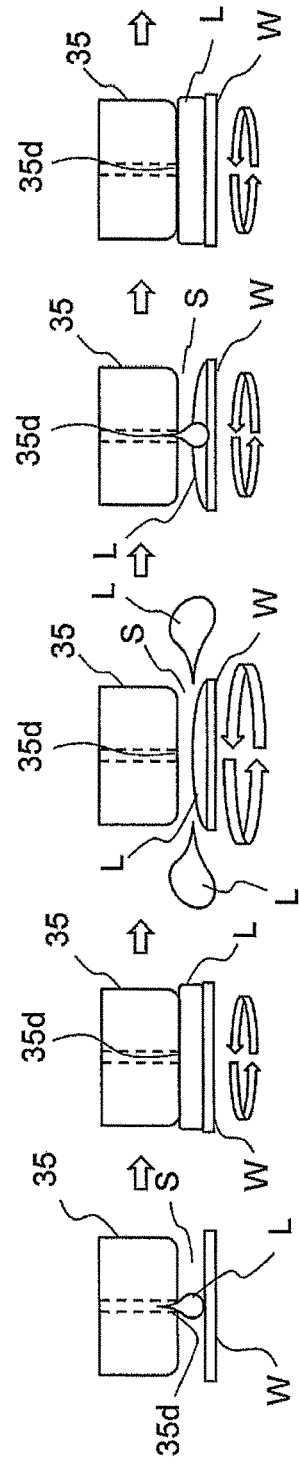
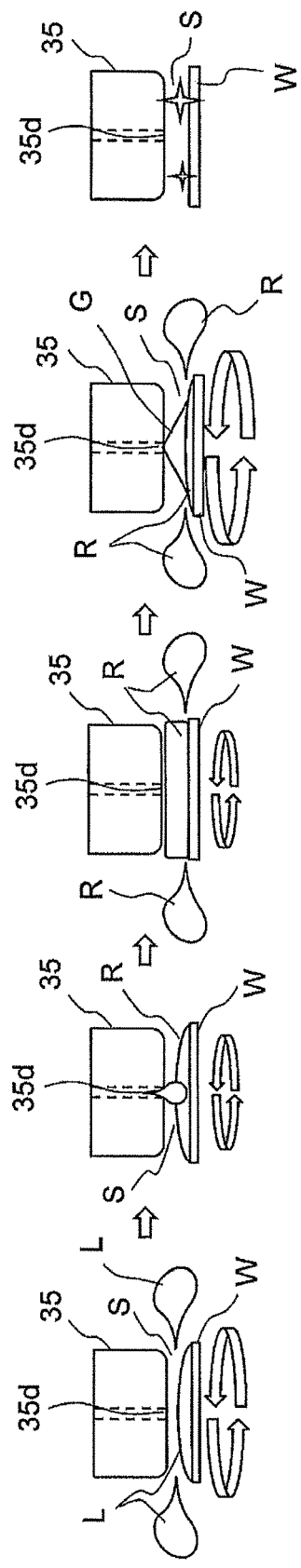

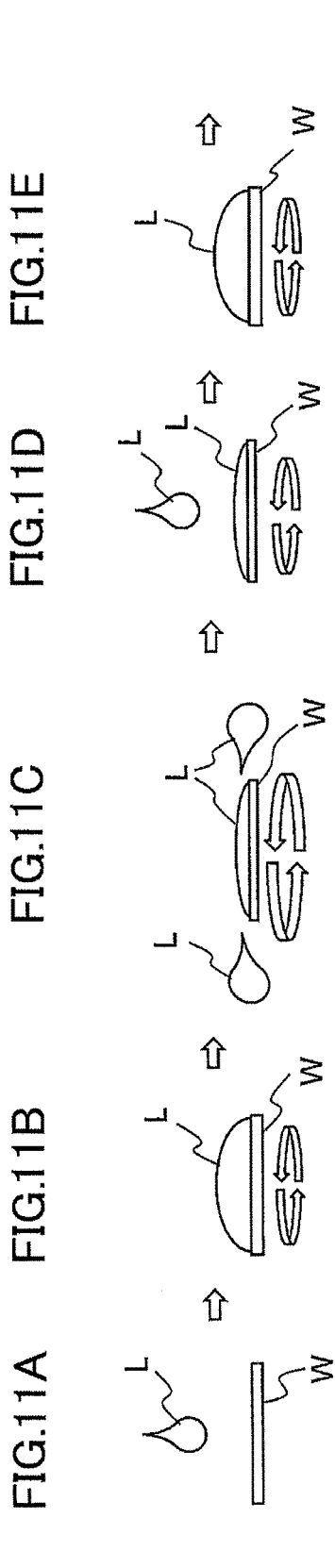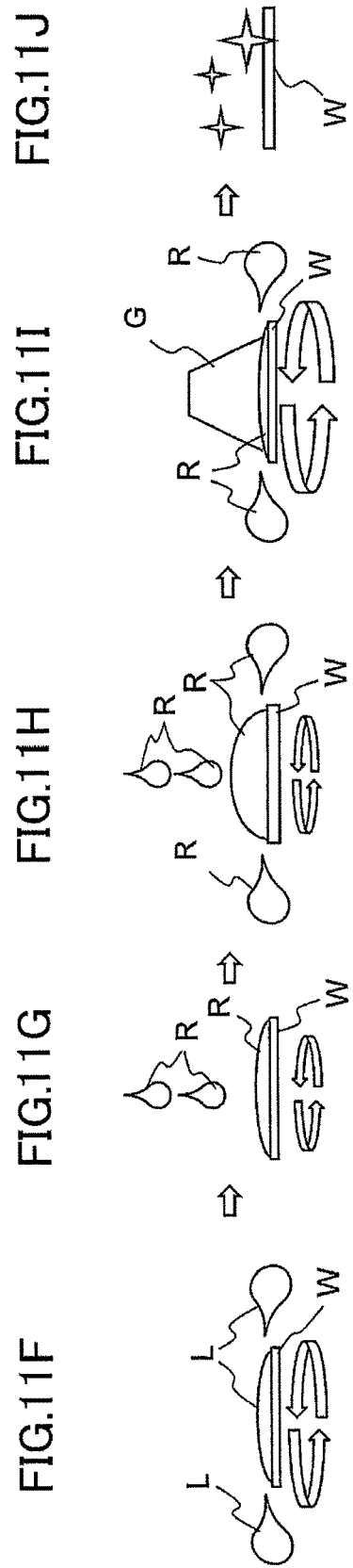

WET PROCESSING APPARATUS

TECHNICAL FIELD

The present invention relates to a wet processing apparatus that cleans an object to be cleaned with a cleaning agent while rotating the object to be cleaned, a wet processing apparatus that supplies a processing liquid to process an object to be processed while heating the object to be processed, and method therefor.

BACKGROUND ART

In recent years, the manufacturing line for semiconductor devices in which this type of wet processing apparatus is used includes a plurality of units called bays in which treatment apparatuses with the same type of functions are brought together within a vast clean room. A layout that employs a job-shop system has become the mainstream. In the job-shop system, the bays are coupled together by a conveyance robot and a belt conveyer. As the workpiece treated in that manufacturing line, a wafer with a large diameter of, for example, 12 inches is used. In the production system, thousands of semiconductor chips are manufactured from one wafer.

However, with this job-shop system, in the case where a plurality of similar treatment processes are repeated, the conveyance within the bay or the conveyance distance between bays significantly increase in length, and the wait time increases. Thus, the manufacturing time and work in process increase, which leads to a cost increase. Therefore, the low productivity may become a problem as a manufacturing line for mass production of the workpieces. Therefore, instead of the conventional manufacturing line in the job-shop system, a manufacturing line in a flow-shop system is also proposed. In this manufacturing line, semiconductor treatment apparatuses are arranged in the order corresponding to the treatment processes.

While this manufacturing line in the flow-shop system is optimal for manufacturing singular products in large quantities, it is necessary to rearrange the installation of the respective semiconductor treatment apparatuses in the manufacturing line in the order corresponding to the treatment flow of the workpiece in the case where the manufacturing procedure (recipe) needs to be changed due to a change of products. However, this rearrangement for every change of product is not realistic considering labor and time for the rearrangement. Especially, under the circumstances in which huge semiconductor treatment apparatuses are fixedly disposed within the closed space that is the clean room, it is realistically impossible to rearrange the semiconductor treatment apparatuses every time.

There is the need for manufacturing semiconductor in very small quantities, for example, several pieces to several hundreds of pieces in a manufacturing unit for engineer samples or ubiquitous sensors. However, in a huge manufacturing line in the job-shop system or the flow-shop system described above, manufacturing semiconductor in very small quantities extremely reduces the cost performance. Therefore, other kinds of products need to be also manufactured in that manufacturing line.

However, when a wide variety of products are received at the same time for mixed production in that manner, the productivity of the manufacturing line further decreases with increasing number of types of products. As a result, in this huge manufacturing line, very small-quantity production and multiproduct production cannot be appropriately managed.

Therefore, Patent Literature 1 discloses a minimal fab system where one device is created on a 0.5 inch size (half-inch size) wafer basically, thus, a manufacturing process is configured of a plurality of portable unit process apparatuses to facilitate the rearrangement of the plurality of unit process apparatuses in the flow-shop and the job-shop. Accordingly, the minimal fab system appropriately manages very small-quantity production and multiproduct production.

Furthermore, Patent Literature 2 discloses a spin development apparatus as a development apparatus for the minimal fab system. The spin development apparatus slowly rotates a wafer with a rotation speed in which a developer does not spill from the wafer in a state where the developer is dropped on the wafer with an amount below an amount that the developer spills from the wafer.

CITATION LIST

Patent Literature

PATENT LITERATURE 1: International Publication Pamphlet No. WO 2012/029775
PATENT LITERATURE 2: International Publication Pamphlet No. WO 2013/084574

SUMMARY OF INVENTION

Technical Problem

The minimal fab system disclosed in the above-described Patent Literature 1 is a method that processes the half-inch size wafer with the unit process apparatuses one by one. While the spin development apparatus disclosed in the above-described Patent Literature 2 has been known as a device that develops an object to be developed, for example, printed on the half-inch size wafer, in the cleaning apparatus that cleans the half-inch size wafer (the object to be cleaned), an apparatus and a method that efficiently clean the object to be cleaned with a lesser amount of a cleaning liquid (cleaning agent) have been unknown.

In the wet processing apparatus that develops and cleans the half-inch size wafer (the object to be processed), even if a little amount of the developer or the cleaning liquid (the processing liquid) is used, an apparatus and method that efficiently performs a heating process have been unknown.

The present invention has been made in view of the above-described actual situation of the conventional techniques, and its object is to provide a wet processing apparatus and a method to be employed in such as the above-described minimal fab system where, as a cleaning system for an extremely small wafer such as the half-inch size, the object to be cleaned is efficiently cleaned with a little amount of the cleaning agent, or as a heating wet processing system, the extremely small wafer is efficiently subject to the heating wet processing.

Solution to Problem

To achieve the above-described object, the present invention provides a wet processing apparatus that cleans an object to be cleaned with a cleaning agent while rotating the object to be cleaned. The wet processing apparatus includes a stage where the object to be cleaned is placed, a rotary driving unit that rotates the stage in a circumferential direction, a supply nozzle that is disposed facing the object to be cleaned placed on the stage and supplies the cleaning agent on the object to be cleaned placed on the stage, and a control unit that causes the supply nozzle to supply a space that is over approximately entire the object to be cleaned placed on the stage and lies between the supply nozzle and the object to be cleaned with a predetermined amount of the cleaning agent to fill the space.

According to the present invention with such configuration, the supply nozzle supplies the space that is over approximately entire the object to be cleaned and lies between the supply nozzle and the object to be cleaned with the predetermined amount of the cleaning agent to fill the space after the object to be cleaned is placed on the stage. In this state, the rotary driving unit rotates the stage to perform a spin cleaning on the object to be cleaned with the cleaning agent. As a result, the cleaning of the object to be cleaned ensures to be performed with a little amount of the cleaning agent compared with a case where the cleaning agent is continuously supplied during the cleaning of the object to be cleaned. At the same time, rotating the object to be cleaned in a state where the cleaning agent fills the space between the object to be cleaned and the supply nozzle prevents the cleaning agent from spilling down by a centrifugal force from the space between the object to be cleaned and the supply nozzle. This ensures the efficient cleaning of the object to be cleaned.

In the above invention, the present invention provides the wet processing apparatus where the control unit rotates the stage in a state where the cleaning agent fills the space between the object to be cleaned placed on the stage and the supply nozzle.

According to the present invention with such configuration, rotating the stage to rotate the object to be cleaned in a state where the cleaning agent fills the space between the object to be cleaned placed on the stage and the supply nozzle ensures to hold the cleaning agent on the space between the object to be cleaned and the supply nozzle with more certainty. This prevents the cleaning agent from spilling down by the centrifugal force with more certainty.

In the above invention, the present invention provides the wet processing apparatus where the control unit causes the rotary driving unit to rotate the stage with a speed where the cleaning agent filling between the object to be cleaned and the supply nozzle is held on the space between the object to be cleaned and the supply nozzle.

According to the present invention with such configuration, rotating the stage to rotate the object to be cleaned with a speed where the cleaning agent filling between the object to be cleaned and the supply nozzle is held on the space between the object to be cleaned and the supply nozzle. This eliminates the spilling down of the cleaning agent filling between the object to be cleaned and the supply nozzle by the centrifugal force.

In the above invention, the present invention provides the wet processing apparatus where the supply nozzle is configured to be adjusted a distance from the object to be cleaned placed on the stage, and the control unit adjusts the supply nozzle such that the space between the supply nozzle and the object to be cleaned on the stage has a predetermined distance where the cleaning agent is configured to fill the space.

According to the present invention with such configuration, after adjusting the supply nozzle such that the space between the supply nozzle and the object to be cleaned on the stage has a predetermined distance where the cleaning agent is configured to fill the space, the cleaning agent is supplied to the space. That is, the space between the supply nozzle and the object to be cleaned is configured to be adjusted corresponding to such as a property of the cleaning agent. This prevents the cleaning agent from spilling down from the space between the object to be cleaned and the supply nozzle in rotating the object to be cleaned, for example, even in a case where a cleaning agent with a different property is used for cleaning the object to be cleaned.

In the above invention, the present invention provides the wet processing apparatus where the object to be cleaned is a wafer that has a plate shape in a predetermined size, the cleaning agent is a cleaning liquid, and the control unit causes the supply nozzle to supply a predetermined amount of the cleaning liquid that is held by a surface tension on a space between the wafer and the supply nozzle.

According to the present invention with such configuration, supplying a predetermined amount of the cleaning liquid that is held by a surface tension on a space between the wafer placed on the stage and the supply nozzle ensures the cleaning of the wafer with a little amount of the cleaning liquid compared with a case where the cleaning liquid is continuously supplied during the rotation of the wafer for cleaning. At the same time, the cleaning liquid is held on a space between the wafer and the supply nozzle by a surface tension. This prevents the cleaning liquid from spilling down from the space between the wafer and the supply nozzle in rotation.

To achieve the above-described object, the present invention provides a wet processing method that includes an placing step of placing an object to be cleaned on a stage, a supplying step of supplying a space that is over approximately entire the object to be cleaned placed on the stage and lies between a supply nozzle disposed facing the object to be cleaned and the object to be cleaned with a predetermined amount of a cleaning agent to fill the space, and a cleaning step of cleaning the object to be cleaned with the cleaning agent while the stage is rotating.

According to the present invention with such configuration, after the placing step places the object to be cleaned on the stage, the supplying step supplies the space that is over approximately entire the object to be cleaned and lies between the supply nozzle and the object to be cleaned with the predetermined amount of the cleaning agent to fill the space, and the cleaning step cleans the object to be cleaned with the cleaning agent while the stage is rotating. As a result, the cleaning of the object to be cleaned ensures to be performed with a less amount of the cleaning agent compared with a case where the cleaning agent is continuously supplied during the cleaning of the object to be cleaned. At the same time, rotating the object to be cleaned in a state where the cleaning agent fills the space between the object to be cleaned and the supply nozzle prevents the cleaning agent from spilling down by a centrifugal force from the space between the object to be cleaned and the supply nozzle. This ensures the efficient cleaning of the object to be cleaned.

In the above invention, the present invention provides the wet processing method where the cleaning step rotates the stage with a speed where the cleaning agent is held on the space between the object to be cleaned and the supply nozzle.

According to the present invention with such configuration, the cleaning step rotates the stage with a speed where the cleaning agent is held on the space between the object to be cleaned and the supply nozzle. This eliminates the spilling down of the cleaning agent filling between the object to be cleaned and the supply nozzle by the centrifugal force.

In the above invention, the present invention provides the wet processing method where the cleaning step rotates the stage with a speed where the cleaning agent does not spill down from the space between the object to be cleaned and the supply nozzle.

According to the present invention with such configuration, the cleaning step rotates the stage with a speed where the cleaning agent does not spill down from the space between the object to be cleaned and the supply nozzle. This eliminates the spilling down of the cleaning agent filling between the object to be cleaned and the supply nozzle in rotation.

In the above invention, the present invention provides the wet processing method where the supplying step relatively moves the supply nozzle and the stage to adjust a distance between the supply nozzle and the object to be cleaned placed on the stage to a predetermined distance such that the cleaning agent fills the space between the supply nozzle and the object to be cleaned, and supplies the cleaning agent to the space.

According to the present invention with such configuration, after the supplying step relatively moves the supply nozzle and the stage to adjust a distance between the supply nozzle and the object to be cleaned placed on the stage to a predetermined distance such that the cleaning agent fills the space between the supply nozzle and the object to be cleaned, the supplying step supplies the cleaning agent to the space. That is, the space between the supply nozzle and the object to be cleaned is configured to be adjusted corresponding to such as a property of the cleaning agent. This prevents the cleaning agent from spilling down from the space between the object to be cleaned and the supply nozzle in rotating the object to be cleaned, for example, even in a case where a cleaning agent with a different property is used for cleaning the object to be cleaned.

In the above invention, the present invention provides the wet processing method where the object to be cleaned is a wafer that has a plate shape in a predetermined size, the cleaning agent is a cleaning liquid, and the supplying step supplies a predetermined amount of the cleaning liquid that is held by a surface tension on a space between the wafer and the supply nozzle.

According to the present invention with such configuration, supplying a predetermined amount of the cleaning liquid that is held by a surface tension on a space between the wafer placed on the stage and the supply nozzle ensures the cleaning of the wafer with a little amount of the cleaning liquid compared with a case where the cleaning liquid is continuously supplied during the rotation of the wafer for cleaning. At the same time, the cleaning liquid is held on a space between the wafer and the supply nozzle by a surface tension. This prevents the cleaning liquid from spilling down from the space between the wafer and the supply nozzle in rotation.

The present invention provides a wet processing apparatus that supplies a processing liquid to process an object to be processed while heating the object to be processed. The wet processing apparatus includes a stage where the object to be processed is placed, a supply portion that supplies the processing liquid to the object to be processed placed on the stage, and a heating portion that is disposed on a position facing the object to be processed placed on the stage to heat at least an interface portion of the object to be processed and the processing liquid.

According to the present invention with such configuration, after the placing of the object to be processed on the stage, the supply portion supplies the processing liquid to the object to be processed. In this state, the heating portion disposed on the position facing the object to be processed placed on the stage heats at least an interface portion of the object to be processed and the processing liquid. As a result, the heating portion heats the interface portion as an optimal portion for processing the object to be processed with the processing liquid. Then, the heating wet processing is efficiently performed.

In the above invention, the present invention provides the wet processing apparatus where the heating portion is disposed on an opposite side of the object to be processed placed on the stage across the stage to heat the interface portion of the object to be processed and the processing liquid via the object to be processed.

According to the present invention with such configuration, the heating portion disposed on an opposite side of the object to be processed placed on the stage across the stage performs the heating. This ensures the interface portion of the object to be processed and the processing liquid to be heated via the object to be processed. Accordingly, the interference of the installation portion of the heating portion and the supply portion are reduced, and the interface portion of the object to be processed and the processing liquid is appropriately heated.

In the above invention, the present invention provides the wet processing apparatus where the heating portion includes a light-emitting portion and a condensing portion that collects a light emitted by the light-emitting portion to guide to the interface portion of the object to be processed and the processing liquid.

According to the present invention with such configuration, the light emitted by the light-emitting portion is collected by the condensing portion to guide to the interface portion of the object to be processed and the processing liquid. This ensures the interface portion of the object to be processed and the processing liquid to be heated more appropriately and efficiently.

In the above invention, the present invention provides the wet processing apparatus where the condensing portion includes a reflector that collects the light emitted by the light-emitting portion, and a lens portion that guides the light collected by the reflector to the interface portion of the object to be processed and the processing liquid.

According to the present invention with such configuration, the reflector collects the light emitted by the light-emitting portion, and a lens portion guides the light collected by the reflector to the interface portion of the object to be processed and the processing liquid. This ensures the light emitted by the light-emitting portion to be more efficiently guided to the interface portion of the object to be processed and the processing liquid, and the interface portion of the object to be processed and the processing liquid is heated more appropriately and efficiently.

In the above invention, the present invention provides the wet processing apparatus where the stage is constituted of a plurality of pin materials that hold a peripheral edge of the object to be processed, and integrally disposed with the lens portion while the lens portion is disposed among the plurality of the pin materials.

According to the present invention with such configuration, constituting the stage with a plurality of pin materials that hold a peripheral edge of the object to be processed causes the lens portion to be disposed among the plurality of pin materials. This ensures to integrally dispose the lens portion with the stage. Accordingly, the count of components of the wet processing apparatus is reduced, and the light emitted by the light-emitting portion is guided via the plurality of the pin materials. Then, the interface portion of the object to be processed and the processing liquid is more appropriately and efficiently heated.

In the above invention, the present invention provides the wet processing apparatus where the object to be processed is a wafer that has a plate shape in a predetermined size, and the processing liquid is a cleaning liquid to clean the wafer.

According to the present invention with such configuration, the heating portion disposed on a position facing the wafer placed on the stage heats at least the interface portion of the wafer and the cleaning liquid. This ensures the interface portion as an optimal portion for performing the cleaning process on the wafer with the cleaning liquid to be appropriately heated. Then, the wafer cleaning is efficiently performed.

To achieve the above-described object, the present invention provides a wet processing method that includes an placing step of placing an object to be processed on a stage, a supplying step of supplying a processing liquid to the object to be processed placed on the stage, a processing step of heating at least an interface portion of the object to be processed and the processing liquid from a position facing the object to be processed in a state where the supplying step is supplying the processing liquid.

According to the present invention with such configuration, in a state where the object to be processed is placed on the stage and the processing liquid is being supplied to the object to be processed placed on the stage, at least the interface portion of the object to be processed and the processing liquid is heated from a position facing the object to be processed. As a result, the interface portion as an optimal portion for processing the object to be processed with the processing liquid is appropriately heated. Then, the heating wet processing is efficiently performed.

In the above invention, the present invention provides the wet processing method where the processing step heats the interface portion of the object to be processed and the processing liquid from an opposite side of the object to be processed across the stage via the object to be processed.

According to the present invention with such configuration, the interface portion of the object to be processed and the processing liquid is heated from an opposite side of the object to be processed across the stage via the object to be processed. This reduces the interference of the installation portion of the heating portion for heating the interface portion of the object to be processed and the processing liquid and the installation portion of the supply portion for supplying the processing liquid. At the same time, the interface portion of the object to be processed and the processing liquid is appropriately heated.

Advantageous Effects of Invention

According to the present invention, the supply nozzle supplies the space between the object to be cleaned and the supply nozzle with the predetermined amount of the cleaning agent to fill the space after the object to be cleaned is placed on the stage. As a result, the cleaning of the object to be cleaned ensures to be performed with a less amount of the cleaning agent compared with a case where the cleaning agent is continuously supplied during the cleaning of the object to be cleaned. At the same time, rotating the object to be cleaned in a state where the cleaning agent fills the space between the object to be cleaned and the supply nozzle prevents the cleaning agent from spilling down by a centrifugal force from the space between the object to be cleaned and the supply nozzle. This ensures the efficient cleaning of the object to be cleaned.

According to the present invention, after the placing of the object to be processed on the stage, the supply portion supplies the processing liquid to the object to be processed, and in this state, the heating portion disposed on the position facing the object to be processed placed on the stage heats at least the interface portion of the object to be processed and the processing liquid. As a result, the heating portion heats the interface portion as an optimal portion for processing the object to be processed with the processing liquid. Then, the heating wet processing is efficiently performed.

BRIEF DESCRIPTION OF THE DRAWINGS

FIG. 1 includes external views illustrating a spin cleaning apparatus as a wet processing apparatus according to a first embodiment of the present invention.

FIG. 4 includes cross-sectional views illustrating a wafer carry-in state of the above-described spin cleaning apparatus.

FIG. 5 includes cross-sectional views illustrating a state at the time of transition from the wafer carry-in state to a wafer holding state of the above-described spin cleaning apparatus.

FIG. 6 includes cross-sectional views illustrating the wafer holding state of the above-described spin cleaning apparatus. FIG. 6(a) is a cross-sectional front view, and FIG. 6(b) is a cross-sectional side view.

FIG. 7 includes drawings illustrating a cleaning process by the above-described spin cleaning apparatus. FIG. 7(a) is a time of dropping a cleaning liquid, FIG. 7(b) is a time of cleaning, FIG. 7(c) is a time of wasting the liquid, FIG. 7(d) is a time of adding the cleaning liquid, FIG. 7(e) is a time of cleaning, FIG. 7(f) is a time of wasting the liquid, FIG. 7(g) is a time of dropping a rinse liquid, FIG. 7(h) is a time of cleaning, FIG. 7(i) is a time of blowing, and FIG. 7(j) is a time of completing.

FIG. 8 includes drawings illustrating a part of a spin cleaning apparatus as a wet processing apparatus according to a second embodiment of the present invention.

FIG. 9 includes drawings illustrating a part of a spin cleaning apparatus as a wet processing apparatus according to a third embodiment of the present invention.

FIG. 11 includes drawings illustrating a cleaning process by a spin cleaning apparatus as a wet processing apparatus according to a fifth embodiment of the present invention. FIG. 11(a) is a time of dropping a cleaning liquid, FIG. 11(b) is a time of cleaning, FIG. 11(c) is a time of wasting the liquid, FIG. 11(d) is a time of adding the cleaning liquid, FIG. 11(e) is a time of cleaning, FIG. 11(f) is a time of wasting the liquid, FIG. 11(g) is a time of dropping a rinse liquid, FIG. 11(h) is a time of cleaning, FIG. 11(i) is a time of blowing, and FIG. 11(j) is a time of completing.

DESCRIPTION OF EMBODIMENTS

The following describes the embodiments of the present invention based on the drawings.

First Embodiment

Figures 1A, 1B, 1C:
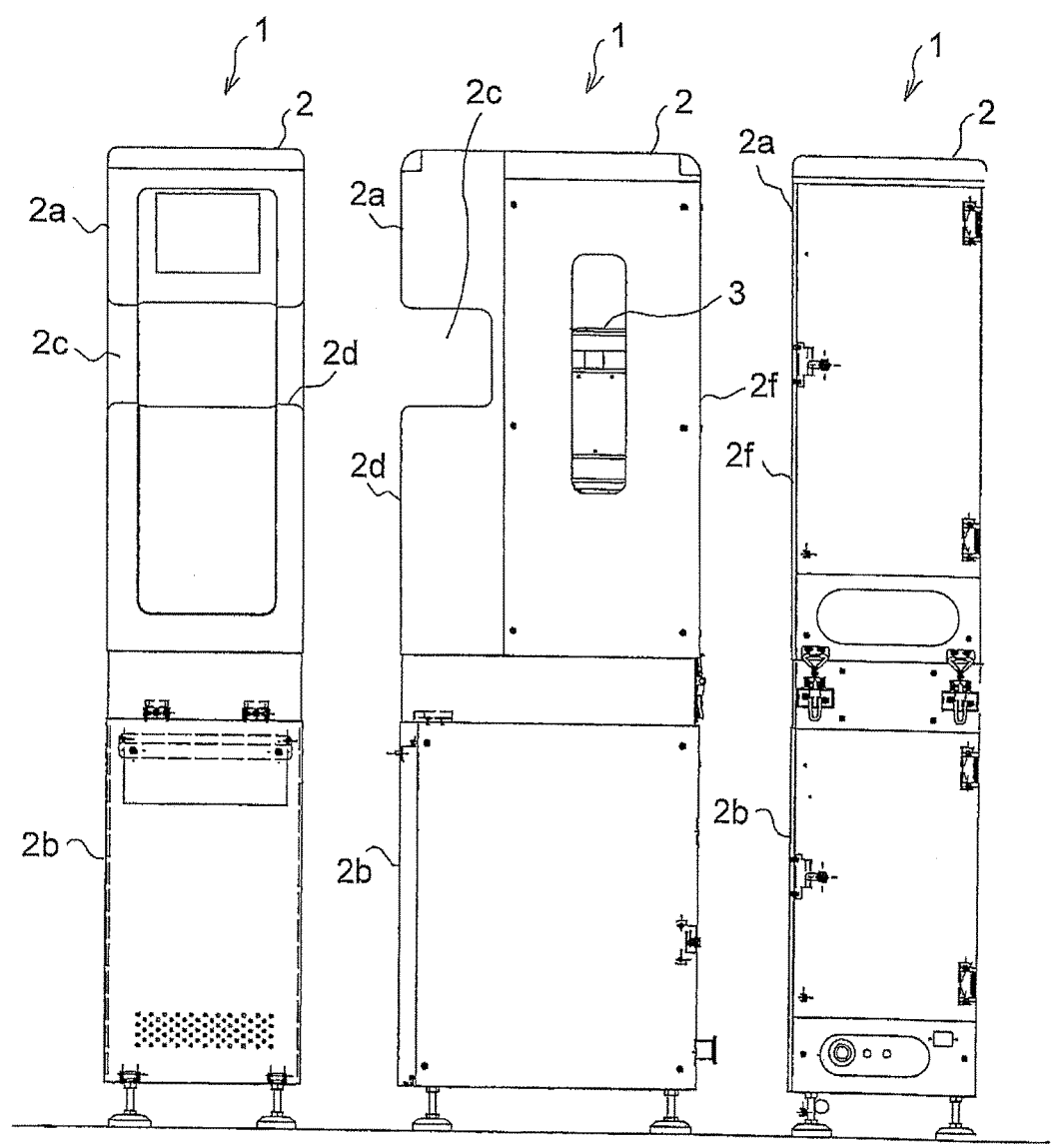
FIG. 1(a) is a front view.
FIG. 1(b) is a right side view.
FIG. 1(c) is a back view.
Figure 2:
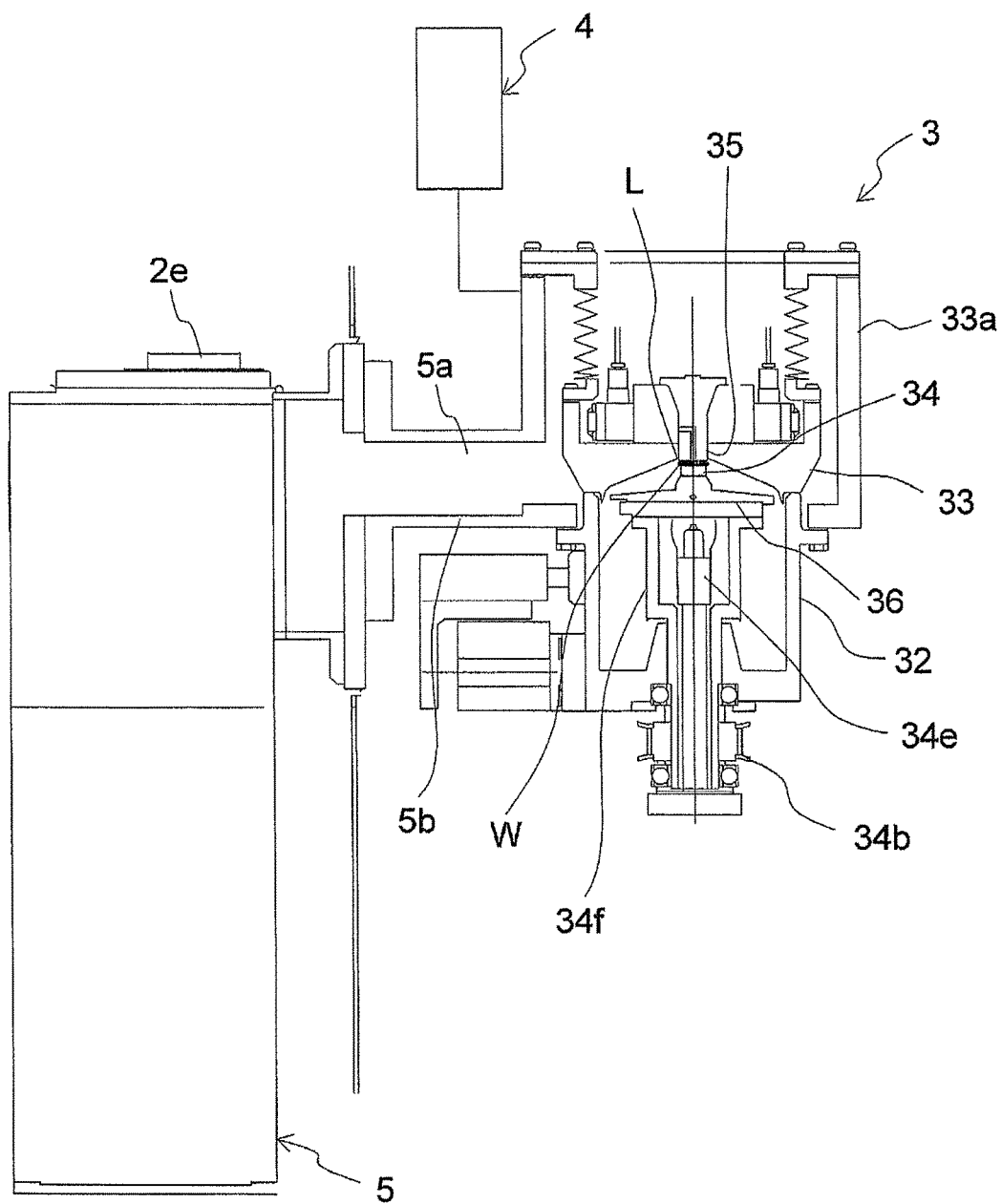
FIG. 2 is a schematic explanatory view illustrating a part of an internal structure of the above-described spin cleaning apparatus.
Figure 3:
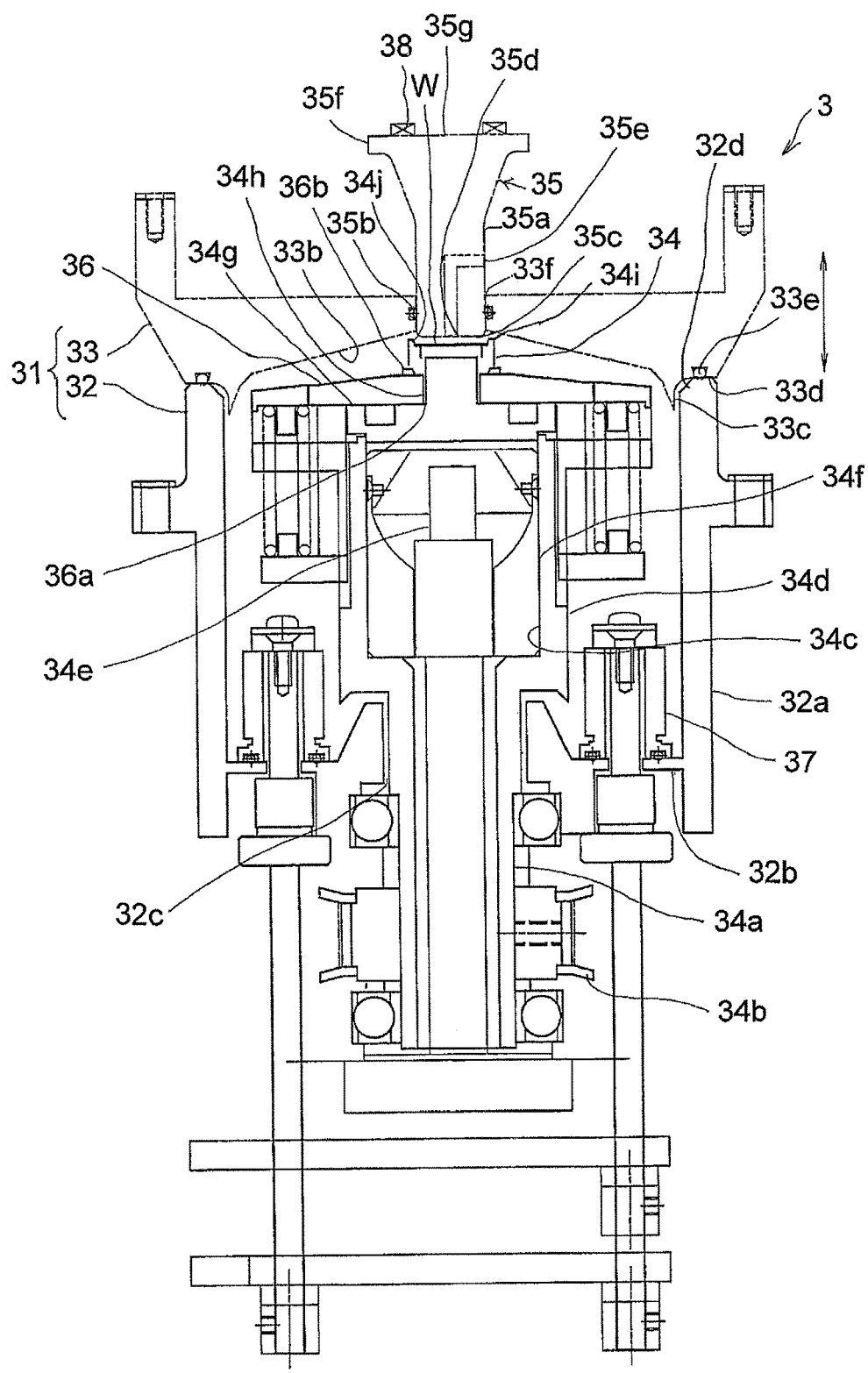
FIG. 3 is a schematic explanatory view illustrating a main body portion of the above-described spin cleaning apparatus.

FIG. 1 includes external views illustrating a wafer cleaner 1 according to a first embodiment of the present invention. FIG. 1 (a) is a front view, FIG. 1 (b) is a right side view, and FIG. 1 (c) is a back view. FIG. 2 is a schematic explanatory view illustrating a part of an internal structure of the wafer cleaner 1. FIG. 3 is a schematic explanatory view illustrating a cleaning unit 3 of the wafer cleaner 1.

<Overall Structure>

The wafer cleaner 1 as a spin cleaning apparatus according to the first embodiment of the present invention is a heating wet processing apparatus that performs a cleaning process on a surface of a wafer W shaped in an approximately disk shape or a rectangular shape of a predetermined size. As illustrated in FIG. 1 and FIG. 2, the wafer cleaner 1 is a minimal cleaning apparatus based on a minimal fab (minimal fabrication) concept. The wafer cleaner 1 is housed in a housing 2 that has a predetermined standard size. Here, the minimal fab concept is a concept that is appropriate to a semiconductor market of many kinds in small quantities. The minimal fab concept can manage various fabrications of resource saving, energy saving, investment saving, and high performance, and achieves a minimal production system where the production is performed with the minimal amount. The minimal production is disclosed in Japanese Unexamined Patent Application Publication No. 2012-54414, for example.

The housing 2 of the wafer cleaner 1 is formed in an approximately rectangular parallelepiped shape that has a longer side in a vertical direction, and has a structure that cuts off minute particles and gas molecules to the internal. The housing 2 houses the cleaning unit 3 in an apparatus upper portion 2a on the upper side of the housing 2. The cleaning unit 3 is a main unit to clean the wafer W that is an object to be cleaned as an object to be processed. The cleaning by the cleaning unit 3 includes cleanings for a removal of a resist on the wafer W, an etching, a removal of such as an attached residue, and similar cleaning.

In the apparatus upper portion 2a or an apparatus lower portion 2b below the cleaning unit 3, a waste liquid tank that stores waste liquids such as used cleaning liquid and rinse liquid used for the cleaning in the cleaning unit 3, a chemical liquid tank that stores a chemical liquid used for the cleaning in the cleaning unit 3, for example, a cleaning liquid L as a cleaning agent of such as Hydrogen fluoride (HF), and a rinse liquid R such as pure water used for rinsing the cleaning liquid remaining on the wafer W after the cleaning, and similar tank are housed. In the apparatus upper portion 2a above the cleaning unit 3, a control unit 4 as a controller to control the driving of the cleaning unit 3 and the supply of the cleaning liquid L is housed.

The housing 2 includes the apparatus lower portion 2b on the lower side to include a raw material supply system to the apparatus upper portion 2a, an exhaust system, a control unit, and similar unit. The apparatus lower portion 2b houses a gas cylinder (not illustrated) that stores gas G (illustrated in FIG. 7) to assist drying such as nitrogen ($N_2$) gas and air. The housing 2 includes a depressed shape portion 2c on the middle portion in the vertical direction of the apparatus upper portion 2a. The depressed shape portion 2c is a portion where the front side of the housing 2 is depressed in concave shape from the side view. The lower side part of the depressed shape portion 2c is a front chamber 2d to carry the wafer W into the housing 2. The front chamber 2d houses a wafer transfer robot 5 illustrated in FIG. 2. The front chamber 2d includes a docking port 2e in an approximately circular shape on the approximately center of the top surface. The docking port 2e is a shuttle housing portion to install a minimal shuttle (not illustrated) as a transfer container.

The docking port 2e is disposed on the top surface of the wafer transfer robot 5. In a state where the docking port 2e is projected from the top surface of the front chamber 2d, the wafer transfer robot 5 is housed in the front chamber 2d. The front chamber 2d has a configuration that cuts off the minute particles and the gas molecules to the inside of the housing 2. The front chamber 2d is configured as a Particle Lock Air-tight Docking (PLAD) system that can put the wafer W housed in the minimal shuttle in and out of the housing 2 without, for example, exposing the external air.

The wafer transfer robot 5 conveys the wafer W carried-in from the docking port 2e to a predetermined position of the cleaning unit 3, and carries the wafer W after cleaned in the cleaning unit 3 out of the housing 2 from the docking port 2e. As the wafer transfer robot 5, for example, a workpiece conveying unit disclosed in Japanese Unexamined Patent Application Publication No. 2011-96942 is employed. As illustrated in FIG. 2, the wafer transfer robot 5 is coupled to the cleaning unit 3 via a wafer transfer space 5a, and expands and degenerates the body of an elongated flat plate shape in the wafer transfer space 5a. The wafer transfer robot 5 employs a telescopic actuator (not illustrated) that puts the wafer W placed on the distal end of the body in and out of the cleaning unit 3.

<Cleaning Unit>

The cleaning unit 3 is housed in a wafer process chamber 2f disposed on the rear side upper portion of the front chamber 2d of the housing 2. The wafer W to be cleaned in the cleaning unit 3 is formed in a disk shape that has a circular surface of a predetermined size, for example, a diameter of 12.5 mm (half-inch size). On the wafer W, a predefined pattern is formed in advance as a state before the cleaning. As the wafer W, even a bare silicon wafer where a photoresist film is removed and similar wafer can be used.

As illustrated in FIG. 3, the cleaning unit 3 includes a cleaning chamber 31. The cleaning chamber 31 is constituted of a lower cup 32 in a closed-end and approximately cylindrical shape, and an approximately disc-shaped upper cup 33 fitted to the lower cup 32. On the center position in the lower cup 32, a stage 34 is disposed rotatably in a horizontal direction. On the center position of the upper cup 33 facing the stage 34, a liquid discharge nozzle 35 as a supply nozzle is disposed. The liquid discharge nozzle 35 is disposed on a position facing the wafer W placed on the stage 34. The liquid discharge nozzle 35 is a supply portion that supplies the cleaning liquid L on the wafer W, and a resonator resonated by an ultrasonic vibrator 38 described later.

<Cleaning Chamber>

The lower cup 32 of the cleaning chamber 31 is formed in an approximately closed-bottomed cylindrical shape constituted of a cylindrical peripheral surface portion 32a and a circular bottom plate portion 32b that covers the bottom portion side of the peripheral surface portion 32a. On the center position of the bottom plate portion 32b, an insertion hole 32c is disposed passing through in a vertical direction. The peripheral surface portion 32a includes a tapered-shaped inclined surface portion 32d on the inner edge portion of the upper end over a circumferential direction. The upper end side of the peripheral surface portion 32a of the lower cup 32 is mounted on the lower side of one end side of a transfer chamber 5b that covers the wafer transfer space 5a for transferring the wafer. Another end side of the transfer chamber 5b is coupled to the wafer transfer robot 5. The bottom plate portion 32b of the lower cup 32 includes a waste liquid port (not illustrated) for discharging the used cleaning liquid L and rinse liquid R flowing into the lower cup 32.

The upper cup 33 is liftably housed in a housing portion 33a coupled to the one end side of the transfer chamber 5b. Below the upper cup 33, a tapered-shaped inner peripheral surface portion 33b is disposed expanding from the center position in an approximately conical shape. On the inner edge portion of the lower end disposed on the outside of the inner peripheral surface portion 33b, a fitting piece portion 33c is disposed projecting downward along the circumferential direction. The fitting piece portion 33c is formed so as to have an outer diameter size approximately equal to an inner diameter size of the peripheral surface portion 32a of the lower cup 32. When the upper cup 33 is moved down to fit to the lower cup 32, the fitting piece portion 33c fits to an inside of the peripheral surface portion 32a of the lower cup 32.

A lower end surface of the upper cup 33 on the outside of the fitting piece portion 33c is an abutting surface 33d that abuts on the upper end portion of the peripheral surface portion 32a of the lower cup 32. On the abutting surface 33d, a packing 33e is mounted over the circumferential direction. When the upper cup 33 is moved down to fit to the lower cup 32, the packing 33e contacts the upper end portion of the peripheral surface portion 32a of the lower cup 32 to fit the upper cup 33 to the lower cup 32 air-tightly.

<Stage>

The stage 34 is disposed on an approximately cylindrical rotation shaft 34a. The rotation shaft 34a is mounted such that the upper end side is housed in the lower cup 32 and the lower end side passes through the center position of the bottom plate portion 32b. On a part projecting outward the lower cup 32 passing through the bottom plate portion 32b, a rotary driving unit 34b that rotatably drives the rotation shaft 34a in the circumferential direction is disposed. An upper end side of the rotation shaft 34a is a lamp housing portion 34d that is concentrically expanded and includes a cylindrical housing space 34c. The housing space 34c of the lamp housing portion 34d includes a lamp 34e such as a xenon lamp on the center position. The lamp 34e is a light-emitting portion.

The lamp 34e is mounted on a position facing the wafer W placed on the stage 34, and is a heating unit to heat at least an interface portion of the wafer W and the cleaning liquid L. The housing space 34c includes a reflector 34f as a condensing portion to cover the lamp 34e. The reflector 34f has a concave arc-shaped internal surface that causes a light emitted from the lamp 34e to be collected on at least the interface portion of the wafer W placed on the stage 34 and the cleaning liquid L.

The lamp housing portion 34d includes a blocking member 34g on the upper end side to obstruct the upper end side of the lamp housing portion 34d. On the center position of the upper side of the blocking member 34g, an approximately column-shaped condenser plate 34h as a lens portion is integrally mounted on the blocking member 34g. The blocking member 34g and the condenser plate 34h are made of material, for example, quartz and single crystal sapphire, that transmits the light. The condenser plate 34h is a light collector that guides the light collected by the reflector 34f to the wafer W placed on the stage 34. Here, the lens portion includes an object that simply transmits the irradiated light in addition to an object that collects the irradiated light.

The stage 34 is constituted of a plurality of, for example, five pieces of, engaging piece portions 34i as a pin material. The stage 34 is mounted with predetermined intervals in the circumferential direction of the condenser plate 34h such that the plurality of engaging piece portions 34i surround the condenser plate 34h. Each engaging piece portion 34i is formed in a rectangular shape in plain view as a different body from the blocking member 34g, and mounted on the blocking member 34g. Each engaging piece portion 34i includes an engaging step portion 34j on an inner side edge of the upper side to lock and support the peripheral edge of the wafer W. One of the engaging piece portions 34i is a chuck pin 34k that moves in conjunction with the vertical movement of a spin table 36 described later. The chuck pin 34k is configured to move in a central axis direction in accordance with the falling of the spin table 36 and move in a radial direction in accordance with the rising of the spin table 36.

On the other hand, the circular spin table 36 is liftably (movably to upper and lower) mounted to fit to the condenser plate 34h of the stage 34. The spin table 36 is moved up and down by air cylinders 37. As illustrated in FIG. 3, the air cylinder 37 is disposed in the lower cup 32 and on the outside of the rotation shaft 34a. The spin table 36 is configured to move up and down from a state where the spin table 36 is raised to the uppermost to a position where the spin table 36 is placed on the blocking member 34g of the stage 34. The air cylinder 37 is configured to be separated from the spin table 36 at this position, and only the air cylinder 37 degenerates.

The spin table 36 includes a circular opening portion 36a on the center position. The opening portion 36a includes a support piece portion 36b on an opening edge of the upper side to receive the wafer W conveyed by the wafer transfer robot 5. A plurality of the support piece portions 36b, for example three pieces, are disposed on positions with regular intervals toward the circumferential direction of the opening portion 36a. The support piece portion 36b is disposed on the peripheral area of the condenser plate 34h on the position so as not to interfere with the engaging piece portion 34i constituting the stage 34. For example, the support piece portions 36b are disposed alternately with the engaging piece portions 34i.

<Liquid Discharge Nozzle>

The upper cup 33 includes an insertion opening 33f on the center position. The distal end side as the lower end side of the liquid discharge nozzle 35 passes through to be mounted on the insertion opening 33f. The liquid discharge nozzle 35 includes a cylindrical inserting portion 35a. The lower end portion of the inserting portion 35a is mounted in a state of projecting downward of the lower end portion of the insertion opening 33f of the upper cup 33. Between the inserting portion 35a and the insertion opening 33f, a circular sealing material 35b to provide air-tightness between the inserting portion 35a and the insertion opening 33f is mounted. The inserting portion 35a is configured to have an outer diameter size approximately equal to the outer diameter size of the wafer W placed on the stage 34. The inserting portion 35a includes a liquid discharge port 35d opened on the center position of a planar lower end surface 35c. The liquid discharge port 35d is concentrically formed with the inserting portion 35a. The liquid discharge port 35d is configured to lead to a liquid supply port 35e opened on an upper side position of the insertion opening 33f of the upper cup 33.

Furthermore, the liquid discharge nozzle 35 is mounted to face the stage 34 such that the center position of the liquid discharge port 35d is positioned on the center position of the wafer W placed on the stage 34. That is, the liquid discharge nozzle 35 is mounted on the center position of the upper cup 33, the upper cup 33 is concentrically mounted with the lower cup 32, and the stage 34 is mounted on the center position of the lower cup 32.

Here, the liquid discharge nozzle 35 is configured to be supplied with the cleaning liquid L in cleaning the wafer W, to be supplied with the rinse liquid R to remove the cleaning liquid L remaining on the wafer W, to be supplied with the gas G to blow off the rinse liquid R from the wafer W. The cleaning liquid L, the rinse liquid R, and the gas G are configured to be transmitted from the liquid supply port 35e to the liquid discharge port 35d. The control unit 4 controls the supply of the cleaning liquid L, the rinse liquid R, and the gas G.

The inserting portion 35a of the liquid discharge nozzle 35 includes a resonator mounting portion 35f on the upper end side. The resonator mounting portion 35f has a shape expanding into a taper shape toward the upper side, and is integrally disposed on the inserting portion 35a. The upper end side of the resonator mounting portion 35f is a flat resonator mounting surface 35g. The resonator mounting surface 35g concentrically includes a circular ultrasonic vibrator (PZT) 38. The ultrasonic vibrator 38 provides an ultrasonic vibration to the cleaning liquid L supplied so as to fill a space S between the liquid discharge nozzle 35 and the wafer W to improve detergency of the cleaning liquid L, to which the ultrasonic vibration is provided, on the wafer W. The resonator mounting surface 35g may be subject to mirror finishing for the purpose of reflecting the light irradiated to the resonator mounting surface 35g to irradiate on the wafer W.

Next, a description will be given of a cleaning method using the wafer cleaner 1 of the above-described first embodiment by referring to FIG. 4 to FIG. 7.

Figure 4A:
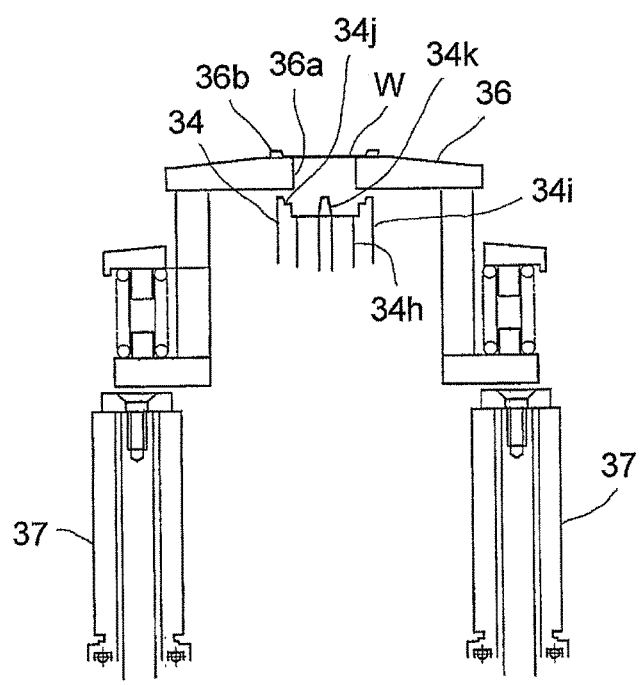
FIG. 4(a) is a cross-sectional front view.
Figure 4B:
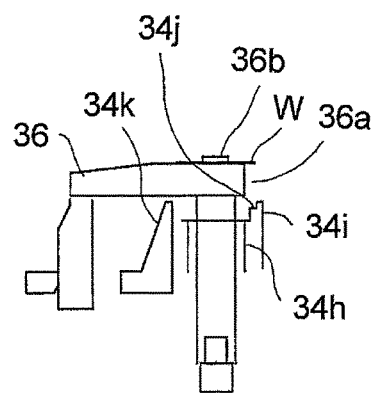
FIG. 4(b) is a cross-sectional side view.
Figure 5A:
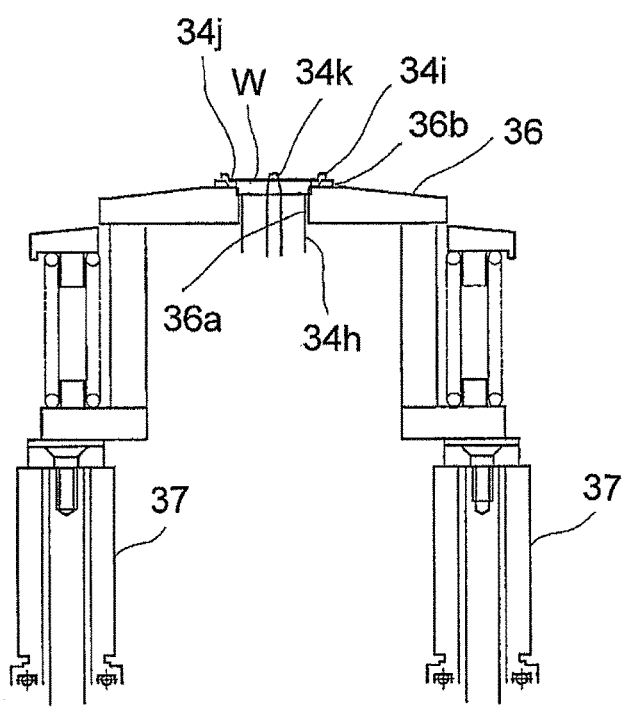
FIG. 5(a) is a cross-sectional front view.
Figure 5B:
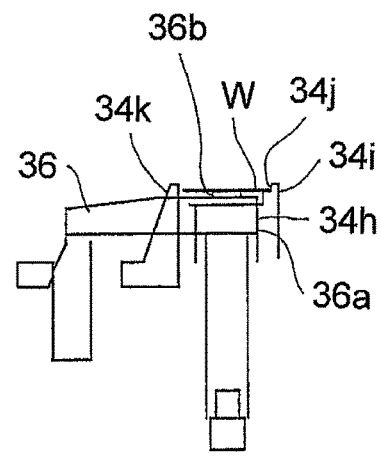
FIG. 5(b) is a cross-sectional side view.

FIG. 4 includes cross-sectional views illustrating a wafer carry-in state of the wafer cleaner 1. FIG. 4(a) is a cross-sectional front view, and FIG. 4(b) is a cross-sectional side view. FIG. 5 includes cross-sectional views illustrating a state at the time of transition from the wafer carry-in state to a wafer holding state of the wafer cleaner 1. FIG. 5(a) is a cross-sectional front view, and FIG. 5(b) is a cross-sectional side view. FIG. 6 includes cross-sectional views illustrating the wafer holding state of the wafer cleaner 1. FIG. 6(a) is a cross-sectional front view, and FIG. 6(b) is a cross-sectional side view. FIG. 7 includes drawings illustrating a cleaning process by the wafer cleaner 1. FIG. 7(a) is a time of dropping a cleaning liquid, FIG. 7(b) is a time of cleaning, FIG. 7(c) is a time of wasting the liquid, FIG. 7(d) is a time of adding the cleaning liquid, FIG. 7(e) is a time of cleaning, FIG. 7(f) is a time of wasting the liquid, FIG. 7(g) is a time of dropping a rinse liquid, FIG. 7(h) is a time of cleaning, FIG. 7(i) is a time of blowing, and FIG. 7(j) is a time of completing.

<Preparation Process>

First, the control unit 4 drives the air cylinder 37 of the cleaning unit 3 to raise the spin table 36 to the uppermost position as illustrated in FIG. 4 (a). At this time, in conjunction with the upward movement of the spin table 36, the chuck pin 34k among the engaging piece portions 34i of the stage 34 moves in a radial direction. As illustrated in FIG. 4 (b), the chuck pin 34k moves to the outside of the position where the wafer W is supported.

<Carry-in Process>

In this state, the minimal shuttle that houses the wafer W to be cleaned is fitted to install on the docking port 2e of the front chamber 2d of the wafer cleaner 1. In this state, a start switch (not illustrated) disposed on a predetermined position of the wafer cleaner 1 is pressed.

Then, the minimal shuttle mounted on the docking port 2e is opened to install the wafer W housed in this minimal shuttle on the distal end portion of the body of the wafer transfer robot 5. Subsequently, the body expands to convey the wafer W placed on the distal end portion of the body among the support piece portions 36b of the spin table 36 via the wafer transfer space 5a. Then, the wafer W is placed among the support piece portions 36b. As illustrated in FIGS. 4 (a) and (b), this provides a state where the wafer W is held among the support piece portions 36b of the spin table 36.

<Placing Process>

Subsequently, the air cylinder 37 is driven to move down the spin table 36 on which the wafer W is placed, as illustrated in FIG. 5 (a). At this time, as illustrated in FIG. 5 (b), in conjunction with the downward movement of the spin table 36, the chuck pin 34k among the engaging piece portions 34i of the stage 34 moves in a central axis direction. As illustrated in FIG. 6 (a) and FIG. 6 (b), the wafer W is placed among the engaging piece portions 34i including the chuck pin 34k. The wafer W placed among the engaging piece portions 34i is held, that is, chucked (sandwiched), by the chuck pin 34k.

At this time, the spin table 36 moves down driven by the air cylinder 37 until mounted on the blocking member 34g of the stage 34. Then, as illustrated in FIG. 6 (a) and FIG. 6 (b), in a state where the spin table 36 is installed on the blocking member 34g, the air cylinder 37 is separated from the spin table 36, and the spin table 36 is configured to be rotatably driven with the stage 34 in the circumferential direction.

Subsequently, as illustrated in FIG. 3, the upper cup 33 moves down until the abutting surface 33d of the upper cup 33 of the cleaning chamber 31 abuts on the upper end portion of the peripheral surface portion 32a of the lower cup 32. This provides a state where the upper cup 33 is fitted to the lower cup 32, and a state where the fitting of the upper cup 33 and the lower cup 32 is held the airtightness by the packing 33e. At this time, the liquid discharge nozzle 35 moves down with the upper cup 33 to be provided with a state where the lower end surface 35c of the liquid discharge nozzle 35 is concentrically with the wafer W placed on the stage 34 and the space S is disposed with a predetermined distance between the wafer W and the lower end surface 35c.

<Cleaning Process>

Next, as a cleaning liquid supply process, the control unit 4 controls the chemical liquid tank to supply the cleaning liquid L of ordinary temperature to the liquid supply port 35e of the liquid discharge nozzle 35. As illustrated in FIG. 7 (a), the cleaning liquid L is dropped on the wafer W from the liquid discharge port 35d of the liquid discharge nozzle 35, and as illustrated in FIG. 7 (b), the surface tension of the cleaning liquid L, the wettability of the lower end surface 35c of the liquid discharge nozzle 35, the wettability of the wafer W, and similar factor cause the approximately entire area of the space S between the lower end surface 35c of the liquid discharge nozzle 35 and the wafer W to be filled with the cleaning liquid L over the entire surface of the wafer W. The liquid discharge port 35d of the liquid discharge nozzle 35 discharges the cleaning liquid L of a predetermined amount to the extent where the cleaning liquid L is not spilt down from the space S, for example, a slight amount of a few ml.

In this state, the ultrasonic vibrator 38 mounted on the liquid discharge nozzle 35 provides the ultrasonic vibration to the cleaning liquid L that fills the space S between the lower end surface 35c of the liquid discharge nozzle 35 and the wafer W. At the same time, the lamp 34e is lighted and the light from the lamp 34e is supplied to the wafer W. The heat based on the light supplied to the wafer W is supplied at least to the interface portion of the wafer W and the cleaning liquid L to heat.

At this time, the light from the lamp 34e is collected by the reflector 34f that covers the lamp 34e. The collected light passes through the condenser plate 34h to be irradiated to the back surface of the wafer W. Then, the cleaning liquid L supplied to the wafer W is heated to the predetermined temperature. Simultaneously, the cleaning liquid L is held in the space S between the lower end surface 35c of the liquid discharge nozzle 35 and the wafer W, the rotation shaft 34a is rotatably driven by the rotary driving unit 34b with a rotation speed of the extent that the cleaning liquid L is not spilt down from the space S, for example, less than 600 rpm, and the wafer W held on the stage 34 is quickly rotated in association with the rotation of the rotation shaft 34a. The ultrasonic vibration, the lamp heating and the quick rotation performs a heating spin cleaning to the wafer W with the cleaning liquid L.

<Liquid Draining Process>

Subsequently, the lamp 34e stops emitting the light and the ultrasonic vibrator 38 stops providing the ultrasonic vibration. Then, as illustrated in FIG. 7 (c), the rotary driving unit 34b rotatably drives the rotation shaft 34a accelerating to equal to or more than 600 rpm for example to blow off and discharge the cleaning liquid L intervened on the space S between the lower end surface 35c of the liquid discharge nozzle 35 and the wafer W by the centrifugal force. At this time, the blown cleaning liquid L is blown on the spin table 36, and the rotation of the spin table 36 itself causes the cleaning liquid L to flow down from the outer peripheral edge of the spin table 36 into the lower cup 32. Then, the cleaning liquid L is discharged outside the cleaning chamber 31 from a waste liquid port disposed on the lower cup 32.

<Continuous Process>

Furthermore, corresponding to predetermined needs such as the service life of the cleaning liquid L because of the deterioration, as illustrated in FIG. 7 (d) to FIG. 7 (f), the above-described cleaning process and liquid draining process are repeated several times to intermittently discharge the cleaning liquid L, the new cleaning liquid L is additionally dropped on the space S between the lower end surface 35c of the liquid discharge nozzle 35 and the wafer W, and the wafer W is quickly rotated to perform the heating spin cleaning. Then, the cleaned used liquid L intervened on the space S is blown off and discharged.

<Rinsing Process>

Next, as illustrated in FIG. 7 (g), in a state where the rotary driving unit 34b rotatably drives the stage 34 to rotate with the rotation speed of less than 600 rpm for example, the chemical liquid tank supplies the rinse liquid R to the liquid supply port 35e of the liquid discharge nozzle 35. Then, the rinse liquid R is continuously dropped on the wafer W from the liquid discharge port 35d of the liquid discharge nozzle 35, and the rinse liquid R washes away and rinses the cleaning liquid L remaining on the wafer W while the rinse liquid R is spilt from the wafer W.

<Drying Process>

Subsequently, the lamp 34e is turned on to heat the wafer W, and as illustrated in FIG. 7 (h), the rotary driving unit 34b rotatably drives the rotation shaft 34a accelerating to, for example, equal to or more than 1000 rpm. And yet, the gas G is supplied to the liquid supply port 35e of the liquid discharge nozzle 35 to be sprayed on the wafer W from the liquid discharge port 35d of the liquid discharge nozzle 35, and the centrifugal force and spraying of the gas G blows the rinse liquid R remaining on the wafer W off the wafer W to blow and dry the wafer W. Then, as illustrated in FIG. 7 (j), the cleaning of the wafer W is completed. At this time, the blown rinse liquid R also flows down from the spin table 36 into the lower cup 32 to be discharged from the waste liquid port of the lower cup 32.

<Carry-Out Process>

Subsequently, a reverse operation of the above-described carry-in process is performed such that the air cylinder 37 drives the spin table 36 to move up from a state illustrated in FIG. 6 (a) and FIG. 6 (b) to a state illustrated in FIG. 4 (a) and FIG. 4 (b). At this time, in conjunction with the moving up of the spin table 36, the chuck pin 34k among the engaging piece portions 34i moves in a radial direction (outside), and as illustrated in FIG. 5 (b), the wafer W is released the chuck by the engaging piece portions 34i to be in an unchucking state. Subsequently, as illustrated in FIG. 4 (a) and FIG. 4 (b), the wafer W is passed among the support piece portions 36b of the spin table 36.

Next, the wafer transfer robot 5 is driven, and after the wafer W is placed on the distal end portion of the body of the wafer transfer robot 5, a returning operation is performed. The wafer W is conveyed into the wafer transfer robot 5 via the wafer transfer space 5a and placed on the minimal shuttle, and the minimal shuttle is subject to a closing operation. Then, removing the minimal shuttle that houses the wafer W from the docking port 2e of the front chamber 2d causes the wafer W to be carried out from the wafer cleaner 1

<Operational Advantage>

As a method to clean a wafer such as a silicon wafer, an RCA clean has been known. The RCA clean is constituted of a combination of a Standard Clean 1 (SC1) clean and a Standard Clean 2 (SC2) clean. The SC1 clean is constituted of ammonia water and hydrogen peroxide solution with a purpose of the removal of particles deposited on the wafer. The SC2 clean is constituted of hydrochloric acid and hydrogen peroxide solution with a purpose of the removal of metal impurities deposited on the wafer. In the RCA clean, each chemical liquid is required to be heated to a predetermined temperature. In the case of an immersion type clean that immerses the wafer in the cleaning liquid, generally, pure water with a large composition ratio is heated, and the heated pure water is mixed with the chemical liquid and used as a cleaning liquid with a predetermined temperature to perform the cleaning. As necessary, the pure water is kept warm by such as a line heater.

On the other hand, in the case of a single-wafer spin cleaning system that continues to constantly supply new cleaning liquid, the cleaning liquid to which the chemical liquid is mixed is stored in such as the tank and heated, and the heated cleaning liquid is supplied on the wafer to clean. That is, in the single-wafer spin cleaning system, the cleaning liquid is required to be kept warm in the predetermined temperature even at the time of waiting before the cleaning of the wafer is performed. This requires an enormous volume of energy for keeping the cleaning liquid warm. The cleaning liquid discharged on the wafer is deprived of heat by the temperature difference between the wafer and the external air to decrease temperature compared with immediately after the discharge. While the cleaning liquid heated to equal to or more than an expected working temperature can be used in light of the temperature decrease, this requires further energy for heating. In the case of the cleaning liquid with a high volatility, heating possibly changes the concentration of the chemical liquid.

Therefore, as described above, according to the wafer cleaner 1 of the above-described first embodiment, in the heating spin cleaning of the wafer W, the cleaning liquid L is supplied to the space S between the lower end surface 35$c$ of the liquid discharge nozzle 35 and the wafer W from the liquid supply port 35$e$ of the liquid discharge nozzle 35. The cleaning liquid L is supplied with a predetermined amount to the extent that the cleaning liquid L is not spilt down from the space S between the lower end surface 35$c$ of the liquid discharge nozzle 35 and the wafer W. As illustrated in FIG. 7 (b), the surface tension of the cleaning liquid L, the wettability of the lower end surface 35$c$ of the liquid discharge nozzle 35, the wettability of the wafer W, and similar factor cause the space S between the lower end surface 35$c$ of the liquid discharge nozzle 35 and the wafer W to be filled with the cleaning liquid L, and a state where the cleaning liquid L is intervened is provided.

In this state, the ultrasonic vibrator 38 provides the ultrasonic vibration to the cleaning liquid L that fills the space S between the lower end surface 35$c$ of the liquid discharge nozzle 35 and the wafer W. At the same time, the light from the lamp 34$e$ is supplied to the wafer W via the reflector 34$f$ and the condenser plate 34$h$. The cleaning liquid L is heated via this wafer W, and the rotary driving unit 34$b$ rotatably drives the stage 34 to quickly rotate the wafer W. This causes the wafer W to be subject to the heating spin cleaning with the cleaning liquid L.

As a result, compared with a case where the heating spin cleaning is performed on the wafer W while the cleaning liquid L is continued to be supplied on the wafer W, the wafer W can be cleaned with a less amount of the cleaning liquid L. At the same time, in a state where the cleaning liquid L fills the space S between the lower end surface 35$c$ of the liquid discharge nozzle 35 and the wafer W, the wafer W is quickly rotated. This causes the surface tension of the cleaning liquid L to ensure the cleaning liquid L to be held in the space S between the lower end surface 35$c$ of the liquid discharge nozzle 35 and the wafer W, and prevents the cleaning liquid L from spilling down by the centrifugal force from the space S. Accordingly, the wafer W can be cleaned efficiently with a little amount of the cleaning liquid L, and the usage of the cleaning liquid L can be saved.

Especially, the wafer cleaner 1 of the first embodiment has the configuration where the lower end surface 35$c$ of the liquid discharge nozzle 35 has a planar shape with the outer diameter size approximately equal to the outer diameter size of the wafer W, and the cleaning liquid L is intervened on the space S between the lower end surface 35$c$ of the liquid discharge nozzle 35 and the wafer W. This causes the thickness of the liquid film of the cleaning liquid L intervened on the space S between the lower end surface 35$c$ of the liquid discharge nozzle 35 and the wafer W to be uniform (constant) from the center position of the wafer W over the outer periphery position. Accordingly, the ultrasonic vibration provided by the ultrasonic vibrator 38 and the quick rotation of the wafer W driven by the rotary driving unit 34$b$ ensure the cleaning liquid L to efficiently convect from the center position of the wafer W over the outer periphery position.

The lower end surface 35$c$ of the liquid discharge nozzle 35 contacts with the cleaning liquid L to act as a fixed end. This ensures the cleaning liquid L to be efficiently stirred, and ensures the cleaning liquid L intervened on the space S between the lower end surface 35$c$ of the liquid discharge nozzle 35 and the wafer W to be efficiently provided with the ultrasonic vibration. Accordingly, the cleaning liquid L intervened on the space S between the lower end surface 35$c$ of the liquid discharge nozzle 35 and the wafer W can be uniformly heated.

The wafer cleaner 1 of the first embodiment has the configuration where the light from the lamp 34$e$ is collected on the reflector 34$f$ to pass the condenser plate 34$h$, and irradiated on the wafer W to be guided such that the light from the lamp 34$e$ is collected on the interface portion of the wafer W and the cleaning liquid L, specifically, the backside surface of the wafer W. Accordingly, compared with a case where the cleaning liquid L to be supplied to the wafer W is heated before supply, a case where such as the stage 34 on which the wafer W is placed is heated to heat the cleaning liquid L to be supplied on the wafer W, and similar case, the light in a contactless state with the wafer W and irradiated on the backside surface of the wafer W is used to heat the wafer W and the cleaning liquid L. This eliminates the necessity for preliminary heating of the cleaning liquid L. Then, the interface portion, as an optimal position for cleaning the surface of the wafer W with the cleaning liquid L, where the wafer W contacts with the cleaning liquid L can be efficiently heated. Controlling the turning on and off of the lamp 34$e$ and controlling the output of the lamp 34$e$ ensures the cleaning liquid L intervened on the space S between the lower end surface 35$c$ of the liquid discharge nozzle 35 and the wafer W to be subject to the temperature control with a good responsiveness.

Further, the wafer cleaner 1 of the first embodiment has the configuration where the stage 34 is constituted of a plurality of the engaging piece portions 34$i$, the engaging step portions 34$j$ of the engaging piece portions 34$i$ lock the wafer W to hold the wafer W, and the configuration where the condenser plate 34$h$ is disposed among the engaging piece portions 34$i$, and the reflector 34$f$ and the lamp 34$e$ are installed downward the condenser plate 34$h$. As a result, the light from the lamp 34$e$ can be linearly irradiated on the backside surface of the wafer W via the reflector 34$f$ and the condenser plate 34$h$, and the light having passed the condenser plate 34$h$ can be directly irradiated on the backside surface of the wafer W. This ensures the efficient irradiation of the light on the wafer W and the efficient heating of the cleaning liquid L via the wafer W.

Furthermore, the wafer cleaner 1 of the first embodiment has the configuration where, with respect to the liquid discharge nozzle 35 for supplying the cleaning liquid L, the lamp 34$e$ is installed on the opposite side across the wafer W such that the light from the lamp 34$e$ irradiates the wafer W to heat the wafer W and the cleaning liquid L is heated with the wafer W. This eliminates the interference by installation portions of the liquid discharge nozzle 35 and the lamp 34$e$, and ensures the interface portion of the wafer W and the cleaning liquid L to be efficiently and appropriately heated.

The rotation speed of the wafer W in the heating spin cleaning is rotatably driven by the rotary driving unit 34$b$ to be a rotation speed to the extent that the cleaning liquid L is not spilt down from the space S between the lower end surface 35c of the liquid discharge nozzle 35 and the wafer W, for example, less than 600 rpm. Accordingly, the centrifugal force generated on the cleaning liquid L in the rotation of the wafer W prevents the cleaning liquid L from being flown down from the space S between the lower end surface 35c of the liquid discharge nozzle 35 and the wafer W.

Furthermore, the wafer cleaner 1 of the first embodiment has the configuration where the liquid discharge nozzle 35 is secured to the center position of the upper cup 33, and the liquid discharge nozzle 35 moves upper and lower in conjunction with the vertical movement of the upper cup 33. Accordingly, adjusting the mounting position of the liquid discharge nozzle 35 to the upper cup 33 ensures a size of the space S between the lower end surface 35c of the liquid discharge nozzle 35 and the wafer W placed on the stage 34 to be held with the cleaning liquid L filling the space S. That is, this allows the size of the space S between the lower end surface 35c of the liquid discharge nozzle 35 and the wafer W to be adjusted corresponding to the property of the cleaning liquid L to be used such as the wettability. Then, even in the case where, for example, the cleaning liquid L with a different property is used to clean the wafer W, the configuration can prevent the cleaning liquid L from spilling down from the space S between the lower end surface 35c of the liquid discharge nozzle 35 and the wafer W, the spilling down possibly occurs in rotating the wafer W.

Moving down the upper cup 33 in a state where the wafer W is placed on the stage 34 causes the abutting surface 33d of the upper cup 33 to abut on the upper end portion of the peripheral surface portion 32a of the lower cup 32, and causes the fitting piece portion 33c of the upper cup 33 to internally fit to the peripheral surface portion 32a of the lower cup 32 to hold the airtightness of the fitting of the upper cup 33 and the lower cup 32. This prevents the cleaning liquid L and the rinse liquid R from spilling from the inside of the upper cup 33 and the lower cup 32 in the case where, after the heating spin cleaning of the wafer W, the cleaning liquid L, which is supplied between the wafer W and the lower end surface 35c of the liquid discharge nozzle 35, and the rinse liquid R, which is supplied on the wafer, are blown off from the wafer W to be wasted by rotating the wafer W.

Second Embodiment

Figure 8A:
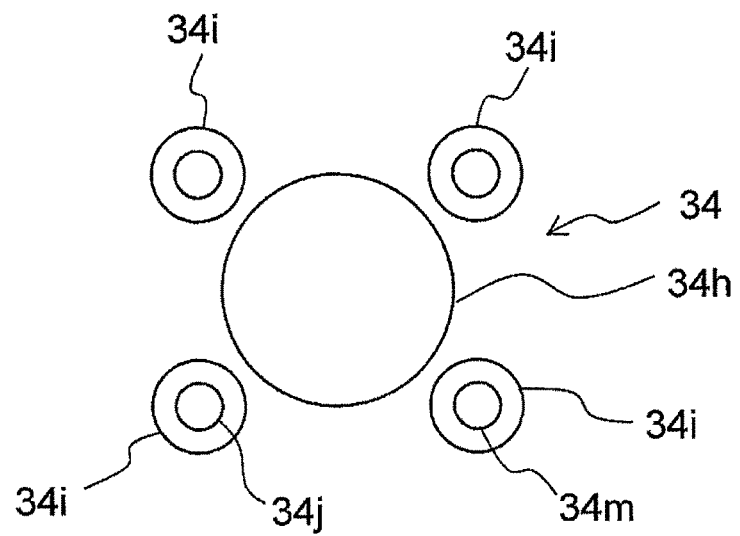
FIG. 8(a) is a plan view.
Figure 8B:
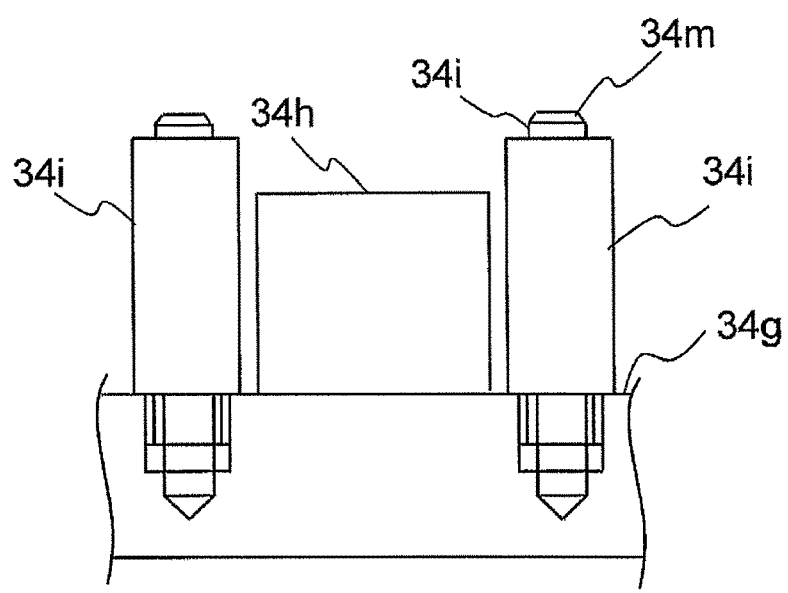
FIG. 8(b) is a side view.

FIG. 8 includes drawings illustrating a part of a wafer cleaner 1 according to a second embodiment of the present invention. FIG. 8 (a) is a plan view, and FIG. 8 (b) is a side view. The second embodiment of the present invention is different from the above-described first embodiment as follows: while, in the first embodiment, the engaging piece portion 34i that constitutes the stage 34 has a rectangular shape in plain view, in the second embodiment, each engaging piece portion 34i has a circular shape in plain view. The second embodiment is otherwise similar to the first embodiment, and like reference numerals designate corresponding or identical elements in the first embodiment.

A plurality of engaging piece portions 34i, for example five pieces, are mounted on a blocking member 34g. As illustrated in FIG. 8 (a) and FIG. 8 (b), each engaging piece portion 34i is mounted separated from one another at regular intervals surrounding a condenser plate 34h. Each engaging piece portion 34i is formed in an approximately cylindrical shape. The lower end portion of each engaging piece portion 34i is disposed to protrude in a state of fitted to the blocking member 34g. Each engaging piece portion 34i includes a locking projection portion 34m on the center position of the upper end side to lock the outer peripheral edge of the wafer W.

Each locking projection portion 34m is formed in an approximately cylindrical shape with an outer diameter size smaller than the outer diameter size of the engaging piece portion 34i, and mounted concentrically with the engaging piece portion 34i. The outer peripheral edge of the upper end side of each locking projection portion 34m has a shape where the diameter is reduced in a tapered shape. The peripheral surface portion of the locking projection portion 34m and the top end surface of each engaging piece portion 34i constitute an engaging step portion 34j of each engaging piece portion 34i. One of the engaging piece portions 34i is a chuck pin 34k as well as the above-described first embodiment.

The second embodiment of the present invention configured as described above provides effects similar to those in the above-described first embodiment. Additionally, forming each engaging piece portion 34i in a cylindrical shape in plain view ensures the strength of the engaging piece portion 34i itself. At the same time, exchanging the engaging piece portion 34i to an engaging piece portion 34i corresponding to the size and the shape of the wafer W on which the wafer cleaner 1 performs the process of the heating spin cleaning ensures the wafer W with various sizes and shapes to be subject to the process of the heating spin cleaning.

Third Embodiment

Figure 9A:
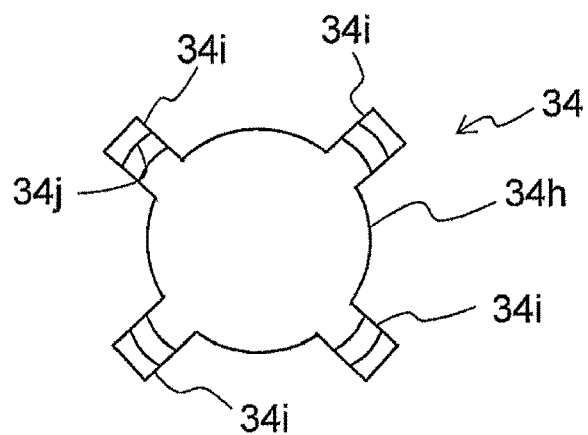
FIG. 9(a) is a plan view.
Figure 9B:
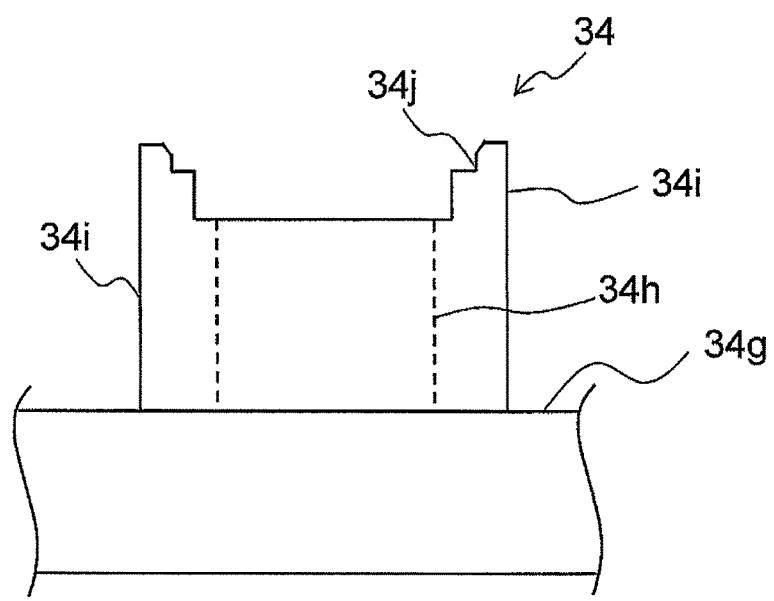
FIG. 9(b) is a side view.

FIG. 9 includes drawings illustrating a part of the wafer cleaner 1 according to a third embodiment of the present invention. FIG. 9 (a) is a plan view, and FIG. 9 (b) is a side view. The third embodiment of the present invention is different from the above-described first embodiment as follows: while, in the first embodiment, each engaging piece portion 34i that constitutes the stage 34 is configured as separate body of the condenser plate 34h, in the third embodiment, each engaging piece portion 34i is integrally configured with a condenser plate 34h. The third embodiment is otherwise similar to the first embodiment, and like reference numerals designate corresponding or identical elements in the first embodiment.

A plurality of engaging piece portions 34i, for example five pieces, are disposed. One of the engaging piece portions 34i is a chuck pin 34k as well as the above-described first embodiment, and movable in a radial direction. As illustrated in FIG. 9 (a) and FIG. 9 (b), the four engaging piece portions 34i in total except the chuck pin 34k are configured in an integrated type integrally mounted on the outer peripheral surface of the condenser plate 34h on the position separated from one another at regular intervals surrounding the condenser plate 34h. The four engaging piece portions 34i in total except the chuck pin 34k are made of material identical to the condenser plate 34h that transmits the light, for example, quartz and single crystal sapphire.

The third embodiment of the present invention configured as described above provides effects similar to those in the above-described first embodiment. Additionally, forming the four engaging piece portions 34i in total except the chuck pin 34k integrated with the condenser plate 34h decrease the number of the components of the wafer cleaner 1. At the same time, the light emitted by the lamp 34e can be transmitted through each engaging piece portion 34i to guide to the wafer W. This ensures the interface portion of the wafer W and the cleaning liquid L to be more appropriately and efficiently heated.

Fourth Embodiment

Figure 10:
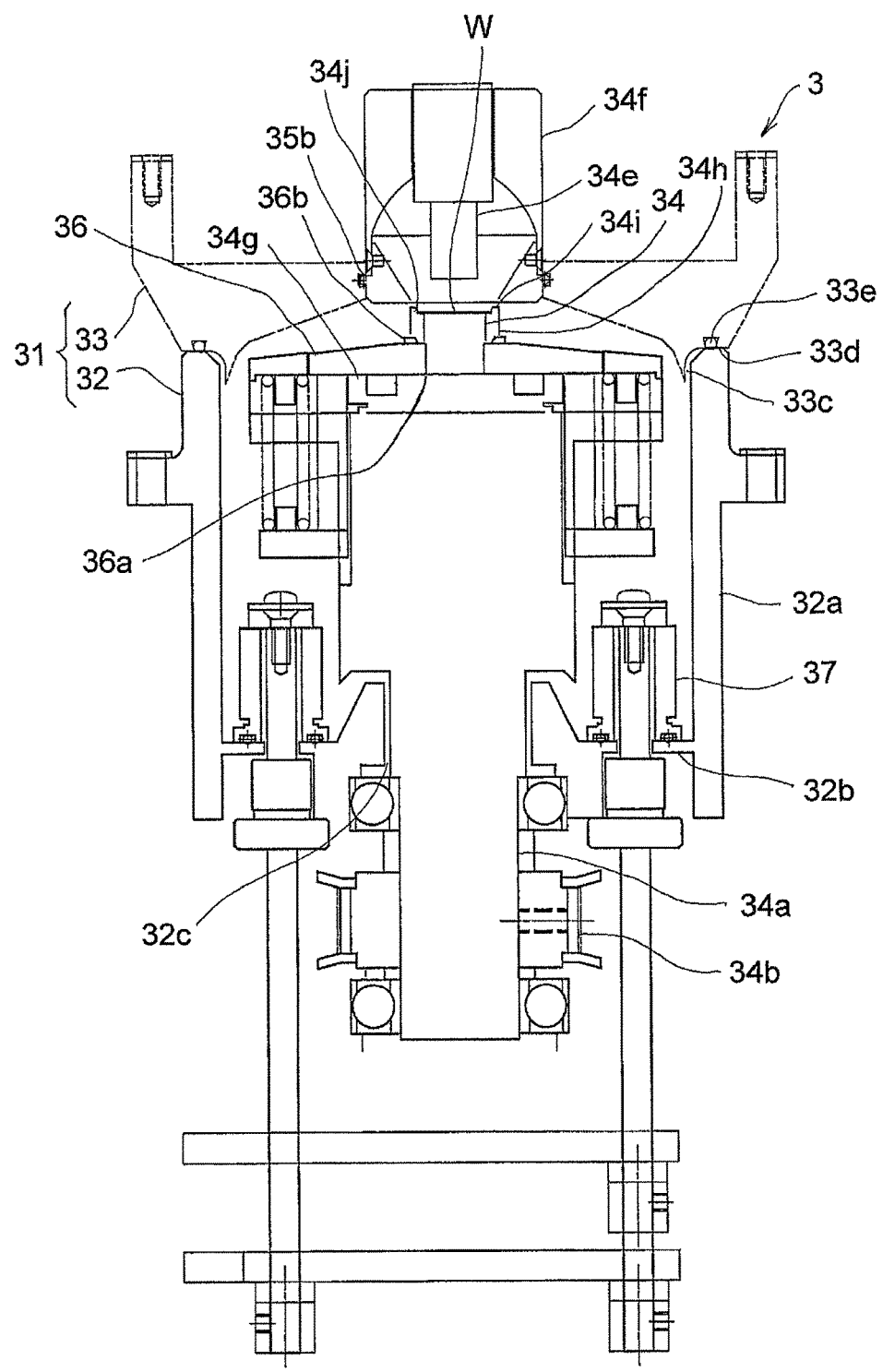
FIG. 10 is a schematic explanatory view illustrating a spin cleaning apparatus as a wet processing apparatus according to a fourth embodiment of the present invention.

FIG. 10 is a schematic explanatory view illustrating a wafer cleaner 1 according to a fourth embodiment of the present invention. The fourth embodiment of the present invention is different from the above-described first embodiment as follows: while the first embodiment has the configuration where the lamp 34e is installed downward the stage 34, the fourth embodiment has the configuration where a lamp 34e is installed above a stage 34. The fourth embodiment is otherwise similar to the first embodiment, and like reference numerals designate corresponding or identical elements in the first embodiment.

The lamp 34e includes a reflector 34f, and the reflector 34f is installed such that the light collected by the reflector 34f irradiates the front surface (surface to be processed) side of the wafer W. That is, the lamp 34e is disposed on the position facing the wafer W. The reflector 34f is fitted and mounted to an insertion opening 33f of the upper cup 33, and collects the light from the lamp 34e housed in the upper cup 33 to irradiate the wafer W.

A liquid discharge nozzle 35 is installed on any position of the upper cup 33, and a cleaning liquid L discharged from the liquid discharge nozzle 35 is configured to be supplied between the lower end surface of the reflector 34f and the wafer W.

In the fourth embodiment of the present invention configured as described above, the lamp 34e is installed on the position facing the wafer W. This provides effects similar to those in the above-described first embodiment. Additionally, the configuration ensures the cleaning liquid L to be directly heated from upside without passing the wafer W. Then, the interface portion of the wafer W and the cleaning liquid L can be more efficiently heated.

Fifth Embodiment

FIG. 11 includes drawings illustrating a cleaning process by a wafer cleaner 1 according to a fifth embodiment of the present invention. FIG. 11 (a) is a time of dropping a cleaning liquid, FIG. 11 (b) is a time of cleaning, FIG. 11 (c) is a time of wasting the liquid, FIG. 11 (d) is a time of adding the cleaning liquid, FIG. 11 (e) is a time of cleaning, FIG. 11 (f) is a time of wasting the liquid, FIG. 11 (g) is a time of dropping a rinse liquid, FIG. 11 (h) is a time of cleaning, FIG. 11 (i) is a time of blowing, and FIG. 11 (j) is a time of completing. The fifth embodiment of the present invention is different from the above-described first embodiment as follows: while the first embodiment has the configuration where the cleaning liquid L fills the space S between the lower end surface 35c of the liquid discharge nozzle 35 and the wafer W to clean the wafer W, the fifth embodiment has the configuration where a cleaning liquid L with an amount of the extent not to spill down is supplied on the wafer W to clean the wafer W. The fifth embodiment is otherwise similar to the first embodiment, and like reference numerals designate corresponding or identical elements in the first embodiment.

<Cleaning Process>

In a cleaning method by the wafer cleaner 1 of the above-described fifth embodiment, first, as illustrated in FIG. 11 (a), the cleaning liquid L is dropped on the wafer W from a liquid discharge port 35d of the liquid discharge nozzle 35, and as illustrated in FIG. 11 (b), the cleaning liquid L is supplied to the extent that the cleaning liquid L does not spill down from the wafer W by the surface tension of the cleaning liquid L, the wettability of the wafer W, and similar factor to fill the whole surface of the wafer W with the cleaning liquid L. Then, a predetermined amount of the cleaning liquid L to an extent that provides a state where the cleaning liquid L swells in a water droplet shape on the wafer W is discharged from the liquid discharge port 35d of the liquid discharge nozzle 35. In this state, an ultrasonic vibration provided by the ultrasonic vibrator 38, heating by the lamp 34e, and the quick rotation of the stage 34 are applied, and the wafer W is subject to the heating spin cleaning with the cleaning liquid L.

<Liquid Draining Process>

Subsequently, as illustrated in FIG. 11(c), the quick rotation of the stage 34 is accelerated to, for example, equal to or more than 600 rpm, and the cleaning liquid L on the wafer W is blown off by the centrifugal force to be discharged.

<Continuous Process>

Furthermore, as illustrated in FIG. 11 (d) to FIG. 11 (f), the above-described cleaning process and liquid draining process are repeated several times as necessary. After a new cleaning liquid L is additionally dropped on the wafer W and subject to the heating spin cleaning, the cleaning liquid L on the wafer W is blown off and discharged.

<Rinsing Process>

Next, as illustrated in FIG. 11 (g), a rinse liquid R is continuously dropped on the wafer W while the stage 34 is quickly rotated, and the rinse liquid R washes away and rinses the cleaning liquid L remaining on the wafer W while the rinse liquid R is spilt from the wafer W.

<Drying Process>

Subsequently, as illustrated in FIG. 11 (h), the quick rotation of the stage 34 is accelerated and a gas G is sprayed on the wafer W. Then, the rinse liquid R remaining on the wafer W is blown off the wafer W, and then dried. As illustrated in FIG. 11 (j), the cleaning of the wafer W is completed.

<Operational Advantage>

In the fifth embodiment of the present invention configured as described above, in the state where the predetermined amount of the cleaning liquid L is supplied on the wafer W to an extent that provides a state where the cleaning liquid L swells in a water droplet shape on the wafer W, the heating spin cleaning is performed. Accordingly, as well as the above-described first embodiment, the wafer W can be cleaned with a less amount of the cleaning liquid L compared with the case where the wafer W is subject to the heating spin cleaning while the cleaning liquid L is continued to be supplied on the wafer W.

[Others]

While in the above-described embodiments, the upper cup 33 of the cleaning chamber 31 is configured to move upper and lower, the present invention is not limited to this. The lower cup 32 may be configured to move upper and lower, or the liquid discharge nozzle 35 may be configured to move upper and lower separated from the upper cup 33 such that the liquid discharge nozzle 35 is allowed to relatively move upper and lower with respect to the wafer W placed on the stage 34.

The configuration that cleans the object to be cleaned other than the wafer W such as a photoresist mask can be employed. Furthermore, as the cleaning liquid L, other than hydrogen fluoride, even ozone water, a mixture of sulfuric acid and hydrogen peroxide solution, potassium hydroxide solution, and similar solution can be applied to use.

Furthermore, the configuration where the lower end surface 35c of the liquid discharge nozzle 35 is subject to mirror finishing, and the light irradiating the lower end surface 35c is reflected to heat the cleaning liquid L and the wafer W can be employed. The lamp may be such as an LED lamp other than the xenon lamp by corresponding to the cleaning liquid to be used and similar method.

Furthermore, while the above-described embodiments described the wafer cleaner 1 that performs the heating spin cleaning of the wafer W, as the wet processing apparatus, a spin development apparatus that performs a heating spin development of the wafer W may be applied to use by using a developer instead of the cleaning liquid L, and similar method.

REFERENCE SIGNS LIST 1 wafer cleaner (wet processing apparatus)
2 housing
2a apparatus upper portion
2b apparatus lower portion
2c depressed shape portion
2d front chamber
2e docking port
2f wafer process chamber
3 cleaning unit
31 cleaning chamber
32 lower cup
32a peripheral surface portion
32b bottom plate portion
32c insertion hole
32d inclined surface portion
33 upper cup
33a housing portion
33b inner peripheral surface portion
33c fitting piece portion
33d abutting surface
33e packing
33f insertion opening
34 stage
34a rotation shaft
34b rotary driving unit
34c housing space
34d lamp housing portion
34e lamp (heating portion, light-emitting portion)
34f reflector (condensing portion)
34g blocking member
34h condenser plate (condensing portion, lens portion)
34i engaging piece portion (pin material)
34j engaging step portion
34k chuck pin
34m locking projection portion
35 liquid discharge nozzle (supply nozzle, supply portion)
35a inserting portion
35b sealing material
35c lower end surface
35d liquid discharge port
35e liquid supply port
35f resonator mounting portion
35g resonator mounting surface
36 spin table
36a opening portion
36b support piece portion
37 air cylinder
38 ultrasonic vibrator
4 control unit (controller)
5 wafer transfer robot
5a wafer transfer space
5b transfer chamber
W wafer (object to be cleaned, object to be processed)
L cleaning liquid (cleaning agent, processing liquid)
S space
G gas

The invention claimed is:

1. A heating wet processing method, comprising:
a placing step of placing a plate-shaped object to be processed on a stage by mounting the object on engaging pins separated from one another at predetermined intervals in a circumferential direction around a condensing plate, the object being mounted on the engaging pins in a state when a surface of the object is oriented upward, and;
a supplying step of supplying a processing liquid from above the stage to the surface of the object placed on the stage; and
a processing step of heating at least an interface between the object and the processing liquid by emitting light:
to the condensing plate to irradiate the object with the light condensed by the condensing plate from a position facing the object engaged by the engaging pins in a state, and
from a position blocked with respect to the stage with a blocking member and irradiate the light to the condensing plate, when the supplying step is supplying the processing liquid, wherein the condensing plate is mounted on the blocking member.

2. The heating wet processing method according to claim 1, wherein
the processing step heats the interface between the object and the processing liquid from an opposite side of the object across the stage via the object.

3. A heating wet processing apparatus that supplies a processing liquid onto a surface of a plate-shaped object to process the object while heating the object, the heating wet processing apparatus comprising:
a stage that includes a condensing plate and a plurality of engaging pins that are mounted separately from one another at predetermined intervals in a circumferential direction around the condensing plate, the plurality of engaging pins engaging the object in a state where the surface of the object is oriented upward;
a liquid discharge nozzle that is provided above the stage and supplies the processing liquid to the surface of the object when the object is engaged by the engaging pins;
a lamp disposed to radiate towards the condensing plate and in a position facing the object when the object is engaged by the engaging pins to heat at least an interface between the object and the processing liquid; and
a blocking member which is provided above the lamp and closes the lamp from the stage and the liquid discharge nozzle, the condensing plate being mounted on the blocking member,
wherein the lamp emits light to the condensing plate and irradiates the object with the light condensed by the condensing plate to heat at least the interface between the object and the processing liquid.

4. The heating wet processing apparatus according to claim 3, wherein
the lamp is disposed on an opposite side of the object placed on the stage across the stage to heat the interface of the object and the processing liquid via the object.

5. The heating wet processing apparatus according to claim 3, wherein
the object is a wafer that has a plate shape in a predetermined size, and
the processing liquid is a cleaning liquid to clean the wafer.

6. The heating wet processing apparatus according to claim 3, wherein
the condensing plate collects a light emitted by the lamp to guide the light to the interface between the object and the processing liquid.

7. The heating wet processing apparatus according to claim 6, wherein
the condensing plate includes a reflector that reflects the light emitted by the lamp, and a lens that guides the light reflected by the reflector to the interface between the object and the processing liquid.

8. The heating wet processing apparatus according to claim 7, wherein
the engaging pins are constituted by a plurality of engaging piece portions for holding a peripheral edge of the object, the lens being disposed among the plurality of the pin materials.

9. The heating wet processing apparatus according to claim 3, wherein the heating wet processing apparatus cleans the object with a cleaning agent while rotating the object to be cleaned, the heating wet processing apparatus further comprising:
a rotary driver that rotates the stage in a circumferential direction;
the liquid discharge nozzle disposed facing the object when the object is placed on the stage, the liquid discharge nozzle supplying the cleaning agent onto the object; and
a controller that causes the liquid discharge nozzle to supply a space with a predetermined amount of the cleaning agent, the space covering approximately the entire surface of the object engaged by the engaging pins, the space being between the liquid discharge nozzle and the object, the predetermined amount of the cleaning agent filling the space.

10. The heating wet processing apparatus according to claim 9, wherein
the liquid discharge nozzle has an adjustable distance from the object engaged by the engaging pins, and
the controller adjusts the liquid discharge nozzle such that the space between the liquid discharge nozzle and the object on the stage has a predetermined distance where the cleaning agent fills the space.

11. The heating wet processing apparatus according to claim 9, wherein
the object is a wafer that has a plate shape in a predetermined size,
the cleaning agent is a cleaning liquid, and
the controller causes the liquid discharge nozzle to supply a predetermined amount of the cleaning liquid held by a surface tension on the space between the wafer and the liquid discharge nozzle.

12. The heating wet processing apparatus according to claim 9, wherein
the controller causes the rotary driver to rotate the stage in a state where the cleaning agent fills the space between the object placed on the stage and the liquid discharge nozzle.

13. The heating wet processing apparatus according to claim 12, wherein
the controller causes the rotary driver to rotate the stage with a speed where the cleaning agent filling between the object and the supply nozzle liquid discharge nozzle is held on the space between the object and the liquid discharge nozzle.

* * * * *